United States Patent
Kimura

(10) Patent No.: US 7,586,366 B2
(45) Date of Patent: Sep. 8, 2009

(54) COMPLEX FILTER CIRCUIT

(75) Inventor: Katsuji Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 85 days.

(21) Appl. No.: 11/703,177

(22) Filed: Feb. 7, 2007

(65) Prior Publication Data
US 2007/0182480 A1    Aug. 9, 2007

(30) Foreign Application Priority Data
Feb. 8, 2006   (JP) .............................. 2006-031444

(51) Int. Cl.
  *H03B 1/00*    (2006.01)
  *H03K 5/00*    (2006.01)
(52) U.S. Cl. ..................................... 327/552
(58) Field of Classification Search .......... 327/551–559
See application file for complete search history.

(56) References Cited

U.S. PATENT DOCUMENTS

| | | | |
|---|---|---|---|
| 7,002,403 B2* | 2/2006 | Marholev | 327/552 |
| 7,196,574 B1* | 3/2007 | Vishinsky | 327/557 |
| 7,242,334 B2* | 7/2007 | Holden | 341/139 |
| 2005/0168274 A1* | 8/2005 | Kimura | 327/552 |
| 2006/0164159 A1* | 7/2006 | Kimura | 327/552 |

OTHER PUBLICATIONS

1) F. Behbahani, et al., "A Fully Integrated Low-IF CMOS GPS Radio With On-Chip Analog Image Rejection" IEEE Journal of Solid-State Circuits, vol. 37, No. 12, Dec. 2002.
2) Hiroshi Tanimoto, "Precautions Relating to Equivalency of the Voorman Method and Shouno Method in Implementation of Complex Filters", Oct. 21, 2000 Hokkaido Branch Meeting, Kitami Institute of Technology.

* cited by examiner

*Primary Examiner*—Quan Tra
(74) *Attorney, Agent, or Firm*—McGinn IP Law Group, PLLC

(57) ABSTRACT

Disclosed is a complex elliptic filter having an order of three or higher which receives two differential signals that differ in phase from each other by 90 degrees are applied and outputs two differential signals that differ in phase from each other by 90 degrees. The complex filter circuit has internally at least two circuit blocks that include a capacitor connected in series with a coupler (gyrator). The complex filter is a third-order inverse Chebychev filter having an equiripple stopband of 40-dB attenuation amount. Alternatively, the coupler (gyrator) between elliptic capacitors is removed. Alternatively, the elliptic capacitors are made substantially equal to the capacitor arranged in parallel therewith. Alternatively, the gm value of an OTA and the capacitance value are each in an integral ratio represented substantially by a geometric progression of 2.

7 Claims, 33 Drawing Sheets

FIG. 29A
REAL CAPACITANCE
FIG. 29B
CAPACITOR TRANSFORMATION
FIG. 29C
POLYPHASE TRANSFORMATION
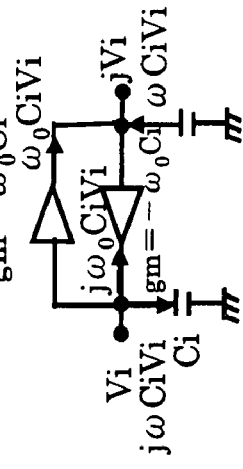
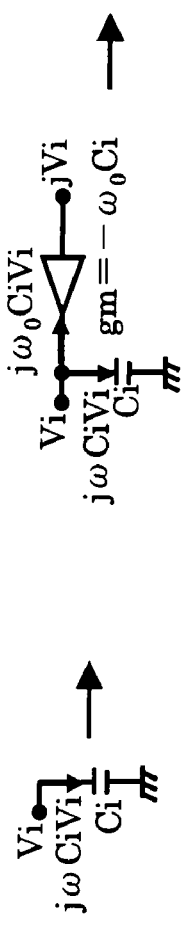

COMPLEX FILTER CIRCUIT

FIELD OF THE INVENTION

This invention relates to a filter circuit and, more particularly, to an on-chip filter circuit integrated on an LSI chip.

BACKGROUND OF THE INVENTION

Conventionally, receivers use a Hartley-type image rejection mixer or a Weaver-type image rejection mixer for the purpose of removing signal components from the image frequency band.

The receivers in low-end radios have recently come to employ a receiving scheme referred to as "low-IF" which has the ability to lower IF frequency with a single superheterodyne and which readily lends itself to LSI fabrication and signal processing.

Since the IF frequency is low, however, image noise cannot be eliminated by an RF filter inserted in front of the mixer. For this reason, a complex filter circuit has come to be used as the filter circuit for extracting the IF signal from the mixer output signal by employing quadrature demodulation for performing signal processing upon producing a difference in phase of 90° in the signal from the mixer onward.

In particular, wireless LANs and GPS receivers often use a low-IF scheme and there are many cases where such complex filter circuits are used.

In such low-end radios, it has become commonplace that circuit functions, such as from the RF circuit of the transceiver (TRX) to signal processing of the baseband are integrated on a single chip and even the complex filter circuit is now integrated on a chip as a matter of course.

Such a radio was implemented in the form of an MSK-modulation-type digital car radio that used a Gaussian filter in time-division multiplexing that the present inventor and his colleagues were charged with designing. Since then, the digital radio became one that digitizes and transmits even voice. This initial digital radio also came to be referred subsequently as GSM and is the de-facto standard in the most widely produced mobile telephones.

In such a digital radio, inter-symbol interference in the band-limiting filter used in the transceiver has a major effect upon bit error.

After GSM, linear modulation schemes came to be used in addition to GSM. Such a band-limiting filter is implemented by an analog filter and is packaged on a chip.

Accordingly, such a band-limiting filter has become the object, the development of which requires a full-time effort by an LSI designer, and use of Bessel filters for the purpose of data transmission, as in a high-capability mobile phone system in Japan prior to GSM, is no longer seen.

Butterworth filters, elliptic filters or Chebychev filters have come to be used recently, and use of inverse Chebychev filters is seen on very rare occasions.

With a band-limiting filter, it is necessary to hold the amount of attenuation in adjacent bands to 60 or 80 dB and to suppress leakage of signals from adjacent bands to a level on the order of 0.1 or 0.01%.

In the case of a band-limiting filter, therefore, a sharp attenuation characteristic is required and filters such as Bessel filters of the past that have a gentle attenuation characteristic in which importance is attached to the phase characteristic are falling out of use.

In view of an attenuation amount, it is better to select a Butterworth filter over a Bessel filter. If an attempt is made to assure a desired attenuation amount even with a lower order, there is a reason for selecting a Chebychev filter or an elliptic filter over a Butterworth filter.

Although a Butterworth filter generally is said to possess a maximally flat characteristic, if a Butterworth filter and an inverse Chebychev of the same order and having the same cut-off frequency are compared, it will be seen that the inverse Chebychev filter is actually the one that has the maximally flat characteristic.

Similarly, it is well known that if a Chebychev filter and an elliptic filter are compared, it is easier to implement a sharp attenuation characteristic with the elliptic filter.

Further, although an inverse Chebychev filter resembles an elliptic filter, the transfer function thereof is introduced by subjecting the transfer function of a Chebychev filter to an inverse transformation, as will be described later.

In view of the foregoing, an inverse Chebychev filter that maintains a maximally flat characteristic in the passband and affords a sharp attenuation characteristic in the stopband can be said to be the type of filter best suited for use as a band-limiting filter.

However, as will be described below, since the method of deriving the transfer function by inversely transforming the transfer function of a Chebychev filter is itself complicated, the current state of the art is that LSI designers have not yet designed a desirable inverse Chebychev filter as an object of full-time development.

For this reason, inverse Chebychev filters are not as commonplace as Bessel filters, Butterworth filters, Chebychev filter and elliptic filters, whose design techniques are easy to comprehend and which are equipped with tables of numerical data indicating device parameters.

In actuality, the design technique is fairly complicated regardless of whether the filter is the Chebychev filter or elliptical filter, and it is believed difficult for LSI designers to learn these techniques in a short period of time. Nevertheless, since tables indicating device parameters have been available for the last 50 years and characteristics can now be confirmed comparatively easily by simulators and the like, implementation on an LSI chip has at least been accomplished.

A complex filter circuit will be described next. A complex filter circuit is one in which the symmetry between the positive frequency characteristic and the negative frequency characteristic on the frequency axis is eliminated by performing a fixed frequency shift along the frequency axis. This is a filter that includes an imaginary number j. Both the amplitude characteristic and phase characteristic of the filter are represented by a function (of fractional type) of s and are decided by the relationship between the real and imaginary parts obtained by making the substitution $s \rightarrow j\omega$. However, an element having an imaginary part that is not dependent on frequency is introduced and therefore both the amplitude and phase characteristics of the filter change.

In general, an LPF (low pass filter) in the real frequency region is transformed to a BPF (band pass filter) and is used in order to assure an attenuation characteristic in the imaginary frequency region. It is used in a low-IF receiver in which it is necessary to attenuate the image frequency in the receiver.

A complex filter circuit is referred to as a polyphase filter.

If we use $H(j\omega)$ in the transfer function $H(s)$ of the filter, the amplitude and phase characteristics of the filter are found from the relationship between the real and imaginary parts.

In a complex filter, $H(j(\omega-\omega_0))$ is used and frequency is shifted by $\omega_0$ along the frequency axis to thereby transform an LPF in the real frequency region to a BPF.

A third-order elliptic ladder LPF illustrated in FIG. 26 will be described first.

If we use R1=R3=1 in the transfer function H(s) of a third-order elliptic LC ladder LPF, the transfer function H(s) is found as follows in a case where C2 has been deleted:

$$H(s) = \frac{2}{C_1 L_2 C_3 s^3 + (C_1 + C_3)L_2 s^2 + (C_1 + L_2 + C_3)s + 2} \quad (1)$$

The numerator is set to 2 in such a manner that H(0)=1 will hold.

The transfer function H(s) is as follows in a case where C2 is added on:

$$H(s) = \frac{2(L_2 C_2 s^2 + 1)}{L_2(C_1 C_2 + C_2 C_3 + C_3 C_1)s^3 + (C_1 + 2C_2 + C_3)L_2 s^2 + (C_1 + L_2 + C_3)s + 2} \quad (2)$$

If the transfer function of Equation (1) is shifted by $\omega_0$ along the frequency axis, then we have the following:

$$H_c(s) = \frac{2}{C_1 L_2 C_3 (s - j\omega_0)^3 + (C_1 + C_3)L_2(s - j\omega_0)^2 + (C_1 + L_2 C_3)(s - j\omega_0) + 2} \quad (3)$$

If the transfer function of Equation (2) is shifted by $\omega_0$ along the frequency axis, then we have the following:

$$H_c(s) = \frac{2\{L_2 C_2 (s - j\omega_0)^2 + 1\}}{C_1 L_2 C_3 (s - j\omega_0)^3 + (C_1 + C_3)L_2(s - j\omega_0)^2 + (C_1 + L_2 + C_3)(s - j\omega_0) + 2} \quad (4)$$

That, we have the following:

$$H_c(j\omega) = \quad (5)$$

$$H(j(\omega - \omega_0)) = \frac{2\{L_2 C_2 (j(\omega - \omega_0))^2 + 1\}}{C_1 L_2 C_3 (j(\omega - \omega_0))^3 + (C_1 + C_3)L_2(j(\omega - \omega_0))^2 + (C_1 + L_2 + C_3)(j(\omega - \omega_0)) + 2}$$

A complex elliptic filter having the transfer function of Equation (5) is illustrated in FIG. 4. Here G1=$\omega_0$C1, G2=$\omega_0$C2, G3=$\omega_0$C3, R2=$\omega_0$L2 holds, wherein G1, G2 and G3 and R2 are assumed to be positive (>0).

By way of example, if a third-order elliptic LPF (C1=C3=0.6229, C2=0.0240, L2=0.9477, R1=R3=1, $\omega_c$=1.823 rad) is shifted along the frequency axis by $\omega_0$=1.92 rad, the filter will be transformed to a BPF having a passband of 0.097 to 3.743 rad and a center frequency of $\omega_0$=1.92 rad, as illustrated in FIG. 27. This is a so-called complex BPF having an asymmetric characteristic with respect to the $\omega$=0 frequency axis.

Thus, the frequency characteristic or phase characteristic of a complex BPF is obtained in simple fashion if a software tool such as Excel, is used to perform a frequency shift of $\omega \rightarrow \omega - \omega_0$.

However, as shown in FIG. 4, the filter structure is complicated. Moreover, a negative conductance and a negative resistance are required, and implementation using passive elements is not possible.

The circuit diagram of a third-order gm-C LPF that emulates an RLC ladder filter is illustrated in FIG. 28. If the elliptic capacitance C2 is deleted, the transfer function H(s) becomes as follows in the case of a single-ended arrangement:

$$H(s) = \frac{g_{m1}g_{m3}g_{m6}}{C_1 C_{L2} C_3 s^3 + C_{L2}(g_{m2}C_3 + g_{m7}C_1)s^2 + (g_{m5}g_{m6}C_1 + g_{m2}g_{m7}C_{L2} + g_{m3}g_{m4}C_3)s + (g_{m2}g_{m5}g_{m6} + g_{m3}g_{m4}g_{m7})} \quad (6)$$

Here a correction for setting H(0)=1 has not been applied.

In the case of a double-ended arrangement (fully differential), we have the following:

$$H(s) = \frac{8g_{m1}g_{m3}g_{m6}}{C_1 C_{L2} C_3 s^3 + 2C_{L2}(g_{m2}C_3 + g_{m7}C_1)s^2 + 4(g_{m3}g_{m6}C_1 + g_{m2}g_{m7}C_{L2} + g_{m3}g_{m4}C_3)s + 8(g_{m2}g_{m5}g_{m6} + g_{m3}g_{m4}g_{m7})} \quad (7)$$

If $g_{m1}$ to $g_{m7}$ are equal and denoted by $g_m$, then H(s) will be expressed as follows in case of the single-ended arrangement:

$$H(s) = \frac{1}{\frac{C_1 C_{L2} C_3}{g_m^3}s^3 + \frac{C_{L2}}{g_m^2}(C_1 + C_3)s^2 + \left(\frac{C_1}{g_m} + \frac{C_{L2}}{g_m} + \frac{C_3}{g_m}\right)s + 2} \quad (8)$$

If $g_{m1}$ to $g_{m7}$ are equal and denoted by $g_m$, then H(s) will be expressed as follows in case of the double-ended (fully differential) arrangement:

$$H(s) = \frac{1}{\frac{C_1 C_{L2} C_3}{8g_m^3}s^3 + \frac{C_{L2}}{4g_m^2}(C_1 + C_3)s^2 + \left(\frac{C_1}{2g_m} + \frac{C_{L2}}{2g_m} + \frac{C_3}{2g_m}\right)s + 2} \quad (9)$$

In the case of an elliptic gm-C LPF onto which the elliptic capacitor C2 has been added, the transfer function H(s) is as follows in the case of the single-ended arrangement:

$$H(s) = \frac{g_{m1}g_{m6}(C_2 C_{L2} s^2 + g_{m3}g_{m6})}{C_{L2}(g_{m6}C_1 C_2 + g_{m6}C_1 C_3 - g_{m6}C_2 C_3 + 2g_{m4}C_2 C_3 + 2g_{m4}C_{L2}^2 C_{L2})s^3 + C_{L2}(g_{m2}g_{m6}C_3 + g_{m2}g_{m6}C_2 + g_{m6}g_{m7}C_1 - g_{m6}g_{m7}C_2 + 2g_{m4}g_{m7}C_2)s^2 + g_{m6}(g_{m5}g_{m6}C_1 + g_{m2}g_{m7}C_{L2} + g_{m3}g_{m4}C_3 + g_{m3}g_{m6}C_2 + g_{m3}g_{m4}C_2 + g_{m4}g_{m5}C_2 - g_{m5}g_{m6}C_2)s + g_{m6}(g_{m2}g_{m5}g_{m6} + g_{m3}g_{m4}g_{m7})} \quad (10)$$

Here a correction for setting H(0)=1 has not been applied.

In the case of the double-ended (fully differential) arrangement, we have the following:

$$H(s) = \frac{2g_{m1}g_{m6}(C_2C_{L2}s^2 + 4g_{m3}g_{m6})}{C_{L2}(g_{m6}C_1C_2 + g_{m6}C_1C_3 - \\ g_{m6}C_2C_3 + 2g_{m4}C_2C_3 + 2g_{m4}C_2^2C_{L2})s^3 + \\ 2C_{L2}(g_{m2}g_{m6}C_3 + g_{m2}g_{m6}C_2 + \\ g_{m6}g_{m7}C_1 - g_{m6}g_{m7}C_2 + 2g_{m4}g_{m7}C_2)s^2 + \\ 4g_{m6}(g_{m5}g_{m6}C_1 + g_{m2}g_{m7}C_{L2} + g_{m3}g_{m4}C_3 + g_{m3}g_{m6}C_2 + \\ g_{m3}g_{m4}C_2 + g_{m4}g_{m5}C_2 - g_{m5}g_{m6}C_1)s + \\ 8g_{m6}(g_{m2}g_{m5}g_{m6} + g_{m3}g_{m4}g_{m7})} \quad (11)$$

If $g_{m1}$ to $g_{m7}$ are equal and denoted by $g_m$, then H(s) will be expressed as follows in case of the single-ended arrangement:

$$H(s) = \frac{\frac{C_2C_{L2}}{g_m^2}s^2 + 1}{\frac{C_{L2}}{g_m^3}(C_1C_2 + C_1C_3 + C_2C_3 + 2C_2^2)s^3 + \\ \frac{C_{L2}}{g_m^2}(C_1 + 2C_2 + C_3)s^2 + \left(\frac{C_1}{g_m} + \frac{C_{L2}}{g_m} + \frac{C_3}{g_m} + \frac{2C_2}{g_m}\right)s + 2} \quad (12)$$

If $g_{m1}$ to $g_{m7}$ are equal and denoted by $g_m$, then H(s) will be expressed as follows in case of the double-ended (fully differential) arrangement:

$$H(s) = \frac{\frac{C_2C_{L2}}{4g_m^2}s^2 + 1}{\frac{C_{L2}}{8g_m^3}(C_1C_2 + C_1C_3 + C_2C_3 + 2C_2^2)s^3 + \\ \frac{C_{L2}}{4g_m^2}(C_1 + 2C_2 + C_3)s^2 + \\ \left(\frac{C_1}{2g_m} + \frac{C_{L2}}{2g_m} + \frac{C_3}{2g_m} + \frac{C_2}{g_m}\right)s + 2} \quad (13)$$

In a gm-C filter, an inductance L is converted to a capacitance C by a gyrator and therefore the element that contributes to frequency is a capacitance only. Accordingly, a complex filter can be constructed by adding on only a negative conductance and a negative resistance is unnecessary.

A capacitance C possesses a conductance element G that is dependent upon frequency ω as is expressed as follows:

$$G = j\omega C \quad (14)$$

If we write $$G(s) = sC \quad (15)$$

then we have the following:

$$G(j\omega) = j\omega C \quad (16)$$

Accordingly, a complex conductance $G(j(\omega-\omega_0))$ of the capacitance C that constructs the complex filter becomes as follows:

$$G(j(\omega-\omega_0)) = j(\omega-\omega_0)C = j\omega C - j\omega_0 C \quad (17)$$

In a quadrature demodulation system, filters for the two channels I and Q are required. Between the I-channel filter and the Q-channel filter, the input signals have a phase difference of 90°. If the input signal to the I-channel filter is V, then the input signal to the Q-channel filter is jV.

Further, in two identical filters, the voltages applied to the respective capacitances have a phase difference of 90° between them and are represented by Vi and jVi.

That is, it is written [see FIGS. 29A and 29B] that the complex conductance of Equation (17) can be implemented by mutually coupling the conductances of the I and Q channels by two OTAs (Operational Transconductance Amplifiers) for which gm=−ω₀C holds.

The filter is as illustrated at FIG. 29C in actuality. Alternatively, FIG. 4 is illustrated also by an equivalent circuit of the kind shown in FIG. 31 using a gyrator.

In comparison with FIG. 4, however, the only difference is the absence of −jGi (=−jω₀Ci) connected in parallel with a capacitance Ci and the current −jGi that is supplied from an OTA. At a glance, it may appear that this is at variance with Kirchhoff's Law because there is no current path.

However, the current of −jGi (=−jω₀Ci) is negative and there is no flow of current in −jGi of FIG. 4. There is equivalence because current flows out of −jGi.

Further, in a gm-C LPF, the OTA is tuned in such a manner that the ratio gm/Ci between gm and capacitance Ci of the OTA will be constant. However, tuning is performed in such a manner that the ratio gm/Ci between gm (=−ω₀Ci) of the OTA, which couples the capacitances, and capacitance Ci will be constant (−ω₀).

Examples of a complex gm-C BPF using the transformation shown in FIG. 29C is nowhere to be found if limited to the case of the elliptic filter.

FIG. 30 illustrates a case where an elliptic capacitor C2 it taken up. In FIG. 30, $g_{mC2}=\omega_0 C_{L2}$ holds. Further, since C2<<C1, C3 holds with regard to the elliptic capacitor C2, G2<<G1, G3 holds in FIG. 4.

Furthermore, in order to reduce the number of OTAs, implementing a complex elliptic gm-C filter by a biquad arrangement of the kind shown in FIG. 32 is also conceivable.

Although it will suffice to couple the elliptic capacitors C2 using a differential OTA, here it is assumed that a load will be placed upon $g_{mc1}$ and $g_{mc3}$.

Even if G2 is doubled and $$g_{m1} = \omega_0(C_1 + C_2),$$

$$g_{m3} = \omega_0(C_3 + C_2)$$

hold, it can be expected that there will be no major shift in the relative position of the transmission zero point.

However, since multiplication by 2 is performed in the term containing $C_2^2$ ($C_2 << C_{L2}$) in the coefficients of $s^3$ in the denominator of Equation (12), some error is produced. (A biquad elliptic gm-C LPF will be described in detail later.)

The foregoing is a method of constructing an ordinary complex filter by a gm-C filter.

In the paper by F. Behbahani et al. cited as an example of the prior art, the above-described complex third-order elliptic gm-C LPF is raised to one of the fifth order. The circuit thereof is shown in FIG. 33.

Similarly, in this example, a coupler that couples the elliptic capacitors between the I and Q channels is not illustrated intentionally. The reason may be that since the circuit is single-ended and the OTA is not displayed as having a differential input, the coupler between the elliptic capacitors requiring a differential OTA cannot be displayed either.

Although Non-Patent Document 2 describes the methods of Voorman and Shouno, the content is completely different from that of the present invention described later.

[Non-Patent Document 1]

F. Behbahani et al., "A Fully Integrated Low-IF CMOS GPS Radio With On-Chip Analog Image Rejection," IEEE Journal of Solid-State Circuits, Vol. 37, No. 12, pp. 1721-1727. December 2002. 2000/7/26-27, pp. 222-224, FIG. 1.

[Non-Patent Document 2]

Hiroshi Tanimoto, "Precautions Relating to Equivalency of the Voorman Method and Shouno Method in Implementation of Complex Filters", 00/10/21 Hokkaido Branch Meeting, Kitami Institute of Technology, Internet Site: <URL:http://www.elec.kitami$_{13}$it.ac.jp/tanimoto/PUBLICATIONS/complex_filter95.pdf>

SUMMARY OF THE DISCLOSURE

The conventional circuits have the problems set forth below.

The first problem is that the flat characteristic in a passband cannot be maintained. The reason is that there are a large number of elements, the element sensitivities of the individual elements are high and the filter characteristics are affected if there is even some mismatching between elements owing to variations in fabrication processes. These factors make it particularly difficult to maintain a flat characteristic in the passband.

The second problem is that since it is necessary to raise the order of the filter in order to obtain the desired attenuation characteristic, the circuit elements increase in number and chip size increases. The reason is that it is necessary to raise the order of the filter in order to assure the desired attenuation characteristic.

The third problem is an increase in current consumed by the filter circuit. The reason is that raising the order of the filter leads to an increase in circuit elements.

Accordingly, the present invention has been devised to solve the foregoing problems and provides a circuit of improved characteristic and performance and that enables a reduction in power consumption and chip size with an architecture of lower order.

The present invention provides a complex filter circuit acting as a higher-order complex elliptic filter having an order of three or higher to which two differential signals that differ in phase from each other by 90 degrees are input and from which two differential signals that differ in phase from each other by 90 degrees are output, the complex filter circuit having internally at least two circuit blocks that include a capacitor connected in series with a coupler (gyrator).

In the present invention, the higher-order complex elliptic filter is a third-order inverse Chebychev filter having an equiripple characteristic in a stopband with an approximately 40-dB stopband attenuation factor.

In the present invention, an arrangement in which a coupler (gyrator) between elliptic capacitors has been removed may be adopted.

In the present invention, the elliptic capacitor may be made approximately equal to the capacitor arranged in parallel therewith.

In the present invention, an arrangement in which elliptic capacitor has been removed may be adopted.

In the present invention, a gm value of an OTA constructing the circuit and capacitance value are each in an integral ratio represented substantially by a geometric progression of 2.

Both the Voorman and Shouno methods described in Non-Patent Document 2 leave the inductor L as is. In the present invention described later, however, a floating inductor L is subjected to an equivalence transformation and is replaced by a capacitor C, and the circuit is configured in fully differential form. Further, the capacitance ratio and ratio of gm in the OTA are specified.

In accordance with the present invention, the desired attenuation characteristic can be implemented by a filter of the lowest order. The reason for this is that the frequency characteristic of the filter can be made the desired attenuation characteristic in the entirety of the circuit inclusive of amplifying means within the filter.

In accordance with the present invention, current consumption can be reduced. The reason is that the order of the filter in the present invention can be minimized.

In accordance with the present invention, chip area can be reduced. The reason is that implementation in the present invention is possible with a filter of the minimum order inclusive of amplifying means.

In accordance with the present invention, an excellent noise characteristic can be obtained. The reason is that in the present invention, noise that has been amplified by amplifying means can be attenuated in a filter section of a latter stage.

Still other features and advantages of the present invention will become readily apparent to those skilled in this art from the following detailed description in conjunction with the accompanying drawings wherein embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 29A, 29B and 29C are an explanatory views for describing methods of implementing a complex filter;

EMBODIMENTS OF THE INVENTION

Figure 1:
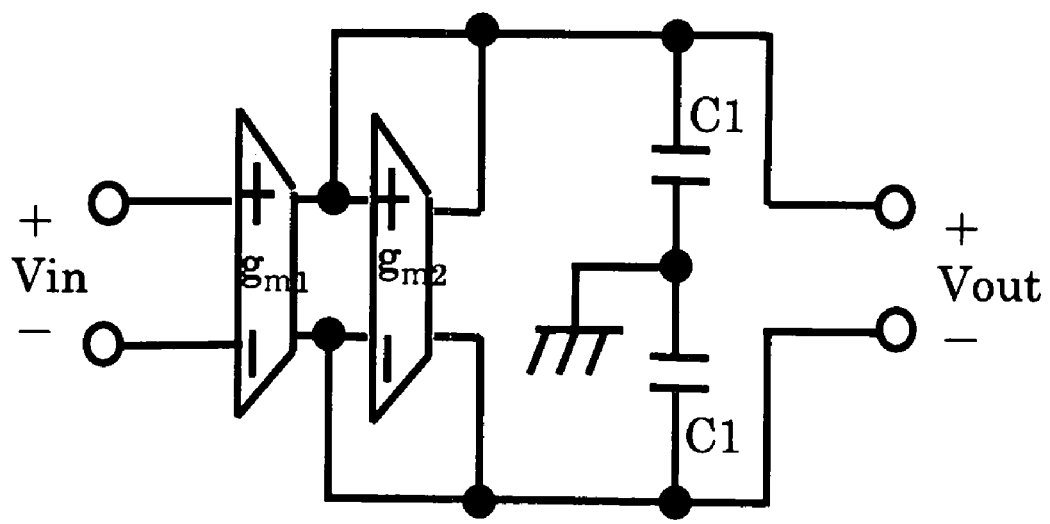
FIG. 1 is a diagram illustrating the structure of a first-order gm-C LPF circuit used in a complex filter according to the present invention.

In Non-Patent Document 1 (the paper by Behbahani et al.), a fifth-order elliptic LC ladder LPF is merely transformed to an elliptic gm-C LPF. It is obvious that consumed current and chip area cannot be reduced unless the number of OTAs is reduced.

In the present application which can achieve reduction of consumed current and chip area, use is made of an inverse Chebychev filter, which is one type of elliptic filter in which a sharp attenuation characteristic and a flat characteristic in a passband can be implemented simultaneously, and the biquad method known as a method of constructing a gm-C filter that reduces the number of OTAs is applied.

Here a method of transforming a third-order inverse Chebychev gm-C LPF, which has been constructed by the biquad method, to a complex biquad gm-C BPF will be described as an example. An inverse Chebychev filter will be described first.

The inverse Chebychev filter is known as a filter having an excellent phase characteristic in a passband. The inverse Chebychev filter is also referred to as a Type-II Chebychev filter.

The inverse Chebychev filter has a passband that is maximally flat and possesses an equiripple characteristic in a stopband since it has a transmission zero point. Magazines often state that "The slope of the attenuation region is equal to a Chebychev characteristic of the same order, and a slope the same as that of a Chebychev characteristic can be obtained even if the passband is made flat." However, this is an obvious admission that the inverse Chebychev filter is completely misunderstood.

In actuality, in comparison with the slope of the attenuation region of the former Chebychev filter, the slope of the attenuation region of an inverse Chebychev filter grows larger from the end of the passband (the −3.01-dB point) to the transmission zero point but has an attenuation characteristic that is much inferior to the attenuation characteristic of the former Chebychev filter in the high-frequency region beyond the transmission zero point, in a manner similar to that of the elliptic filter.

However, the flat characteristic in the passband up to the −3.01-dB point is better than that of the Butterworth filter of the same order. That is, there exists an inverse Chebychev filter as a filter having somewhat improved characteristics of both the elliptic filter with which a steep attenuation characteristic is obtained and the Butterworth filter having the flat characteristic in a passband.

In general, the inverse Chebychev filter is expressed as being flat in the passband and having equiripple in the stopband.

However, a technical analysis of the inverse Chebychev filter is difficult even at a technical level that is not that of the writer in the above-mentioned magazine.

Cases in which the filter is dealt with in ordinary textbooks are rare. Even if they are mentioned, only a mere introduction to the effect that "The inverse Chebychev filter is highly sophisticated technologically and exceeds the level dealt with in this book" is given. Technical books often have only one page on the subject or do not mention it at all. It can be said that the fact that recent books hardly deal with this filter is making it difficult to utilize the inverse Chebychev filter.

The inverse Chebychev filter includes the term "inverse". Here "inverse" means "inverse" in the sense of an "inverse" function. It is necessary to clearly distinguish between the Chebychev filter and the inverse Chebychev filter. Here "inverse" means that the relationship between the passband and the stopband has been reversed in terms of function.

Letting $T_C(s)$ represent the transfer function of the Chebychev filter, $$|T_{IC}(j\omega)|^2 = 1 - |T_C(j\omega)|^2 \quad (18)$$

is obtained in a first stage, and $$|H(j\omega)|^2 = |T_{IC}(j/\omega)|^2 \quad (19)$$

is obtained in a second stage.

The transfer function H(s) of the inverse Chebychev filter is found from Equation (19) in a third stage.

Equation (18) is an interchange of the passband and stopband, and Equation (19) is an interchange of the frequency axis.

That is, by an interchange of the passband and stopband, the following transformation is made: LPF→HPF (HPF→LPF), and by the interchange ($\omega$→1/$\omega$) on the frequency axis, a restoration is made as follows: HPF→LPF (LPF→HPF).

Accordingly, equiripple in the passband shifts to the stopband, and the characteristic that attenuates monotonously with frequency $\omega$ in the stopband changes to a flat characteristic in the passband.

The content set forth above will be described in detail. A third-order Chebychev LPF will be dealt with first.

If we assume that R1=R3=1, C1=C2=c, L2=l holds, then the transfer function $T_C(s)$ of the third-order Chebychev LC ladder LPF will be obtained as follows:

$$T_c(s) = \frac{2}{(cs+1)(cls^2+ls+2)} = \frac{2}{c^2ls^3+2cls^2+(2c+l)s+2} \quad (20)$$

where the numerator is set to 2 in such a manner that $T_C(0)=1$ will hold.

The square of the amplitude characteristic is $$|T_c(j\omega)|^2 = \frac{4}{(2-2cl\omega^2)^2 + \{(2c+l)\omega - c^2l\omega^3\}^2} \quad (21)$$

Interchanging the passband and the stopband, we have the following:

$$1 - |T_c(j\omega)|^2 = \frac{\{(2c+l)\omega - c^2l\omega^3\}^2}{(2-2cl\omega^2)^2 + \{(2c+l)\omega - c^2l\omega^3\}^2} \quad (22)$$

Interchanging the frequency axis, we have the following:

$$1 - |T_c(j/\omega)|^2 = \frac{\{(2c-l)\omega^2 - c^2l\}^2}{(2\omega^3 - 2cl\omega)^2 + \{(2c+l)\omega^2 - c^2l\}^2} \quad (23)$$

What is noteworthy here is the relationship between the numerator and the second term of the denominator. The second term $$\{(2c+l)\omega^2 - c^2l\}^2$$

in the denominator of Equation (23) and the numerator $$\{(2c-l)\omega^2 - c^2l\}^2$$

may be arranged as follows:

$$\{(2c \mp l)\omega^2 - c^2l\}^2$$

If we observe each coefficient of $\omega^n$, the coefficient has a "−" sign in the numerator and a "+" sign in the denominator. Therefore, each coefficient of $\omega^n$ in the numerator is smaller than each coefficient of $\omega^n$ in the denominator.

Accordingly, the transfer function H(s) of the third-order inverse Chebychev LPF is derived as follows:

$$H(s) = \frac{(2c-l)s^2 + c^2l}{2s^3 + (2c+l)s^2 + 2cls + c^2l} \quad (24)$$

$$= \frac{(2c-l)s^2 + c^2l}{(s+c)(2s^2+ls+cl)}$$

It should be noted that Equation (20) is applied also to a third-order Butterworth LPF.

If we take the square root of Equation (23), the amplitude characteristic of the third-order inverse Chebychev LPF indicated in Equation (24) is obtained.

In Equation (23), the denominator is implemented by a first-order LPF and a second-order LPF, and the numerator is implemented by an elliptic capacitor. Accordingly, implementation is possible by a gm-C filter, and the necessary number of OTAs is decided by the order of the filter just as heretofore.

In order to obtain the transfer function H(s) of the inverse Chebychev filter from the transfer function $T_C(s)$ of the Chebychev filter, the following is carried out:

in the denominator, the coefficients are successively interchanged in the following manner: highest order→lowest order (constant);

in the numerator, the term $as^2+b$ that implements the elliptic characteristic is added on as necessary.

The method of obtaining the transfer function of the inverse Chebychev LPF can be generalized as set forth below.

$\alpha_{min}$ [dB] is assumed to be the equiripple of the attenuation region.

If $\alpha_{min}$ is set to 60 dB and n=7 (seventh order) is set, then we have 20 log(ε)=−$\alpha_{min}$ because ε=0.001 (=10$^{-3}$) holds. This is expressed as follows:

$$\varepsilon = 10^{-\frac{\alpha_{min}}{20}} = \sqrt{10^{-\frac{\alpha_{min}}{10}}} \quad (25)$$

Next, the following is introduced:

$$a = \frac{1}{n}\sinh^{-1}\left(\frac{1}{\varepsilon}\right) \quad (26)$$

We use $$\phi_K = \frac{2k+1}{n}\frac{\pi}{2} \quad k = 0, 1, \ldots, 2n-1 \quad (27)$$

For k=0, 1, 2 and 3, 12.8571°, 38.5714°, 64.2857° and 90° are obtained.

The following is obtained:

$$-\alpha_K = \sin h(a) \cdot \sin(\Phi_K) \quad (28)$$

$$\pm\beta_K = \cos h(a) \cdot \cos(\Phi_K) \quad (29)$$

Since $\cos(90°)=0$ holds, we have the following:

$$a_0 = \alpha_3/\cos h(a) \quad (30)$$

$$b_K = 2\alpha_K/\cos h(a) \quad (31)$$

$$c_K = (\alpha_K^2 + \beta_K^2)/\cos h^2(a) \quad (32)$$

With regard to the coefficients in the denominator, we have the following:

$$\Omega_2 = \sin(\pi/n)/\cos h^2(a), \Omega_4 = \sin(2\pi/n)/\cos h^2(a), \Omega_6 = \sin(4\pi/n)/\cos h^2(a) \quad (33)$$

Bringing the above together, we have the following in the case of an odd-numbered order (n=3, 5, 7, . . . ):

$$H(s) = \frac{\prod_{i=1}^{(n-1)/2}(1+\Omega_{2i}^2 s^2)}{(1+a_0 s)\prod_{i=1}^{(n-1)/2}(1+b_{2i}s+c_{2i}s^2)} \quad (34)$$

We have the following in the case of an even-numbered order (n=2, 4, 6, . . . ):

$$H(s) = \frac{\prod_{i=1}^{n/2}(1+\Omega_{2i}^2 s^2)}{\prod_{i=1}^{n/2}(1+b_{2i}s+c_{2i}s^2)} \quad (35)$$

As an example, a method of obtaining the transfer function of an inverse Chebychev LPF whose equiripple characteristic in the stopband is 40 dB is as follows, where it is assumed that n=3 (third order) holds.

$$a = \frac{1}{n}\sinh^{-1}\left(\frac{1}{\varepsilon}\right) \quad (36)$$

Here we have $$\varepsilon = \sqrt{10^{\alpha_{max}/10}-1} \quad (37)$$

and $\alpha_{max}$ (<3 dB) indicates the equiripple value.
Further, we have $$\sin h^{-1}(x) = \ln(x+\sqrt{x^2+1}) \quad (38)$$

$$\cos h^{-1}(x) = \ln(x+\sqrt{x^2-1}) \quad (39)$$

The root is found as follows:

$$-\alpha_K = \sin h(a) \cdot \sin(\Phi_K) \quad (40)$$

$$\pm\beta_K = \cos h(a) \cdot \cos(\Phi_K) \quad (41)$$

Here the following holds:

$$\phi_K = \frac{2k+1}{n}\frac{\pi}{2} \quad k=0, 1, \ldots, 2n-1 \quad (42)$$

In order to obtain a −40-dB equiripple attenuation characteristic in an inverse Chebychev filter, we have $\alpha_{max}$=0.0004342 dB, e=0.01. From Equation (36) we have a=1.766142155 and sin h(a)=2.83862838728775.
Further, we have $F_K$=30°, 90°, 150°, and
$p_1, p_2$=−1.41931419364388±j2.60640717096099
$p_3$=−2.83862838728775 are obtained.

The transfer function of a 0.0004342-dB ripple third-order Chebychev LPF is as follows:

$$T_c(s) = \frac{25.0021}{(s+2.83862839)(s^2+2.83862839s+8.80781112)} \quad (43)$$

Expanding the denominator, we have $$T_c(s) = \frac{25.0021}{s^3+5.67725714.42726s^2+16.86562s+25.0021} \quad (44)$$

Here the cut-off frequency $\omega_{hp}$ (hp: half-power) is given by the following:

$$\omega_{hp} = \cosh\left\{\frac{1}{n}\cosh^{-1}\left(\frac{1}{\varepsilon}\right)\right\} \quad (45)$$

In the case of the 0.0004342-dB ripple third-order Chebychev LPF, the cut-off frequency is $\omega_{hp}$=3.00957237. If the cut-of frequency is made $\omega_{hp}$=1, then the transfer function of the 0.0004342-dB ripple third-order Chebychev LPF will be $$T_c(s) = \frac{0.917196}{s^3+1.8864s^2+1.862056s+0.917196} \quad (46)$$

The transfer function with its denominator factored is as follows:

$$T_c(s) = \frac{0.917196}{(s+0.9432)(s^2+0.9432s+0.97243)} \quad (47)$$

If the coefficients of Equations (3) and (46) are compared, we have c=1.060220526, 1=1.939882512. If these values are substituted into Equation (7), then the transfer function H(s) of the third-order Chebychev LPF is found as follows:

$$H(s) = \frac{0.180559s^2+2.180559}{2s^3+4.060324s^2+4.113407s+2.180559} = \quad (48)$$

$$\frac{0.090279s^2+1.09028}{s^3+2.030162s^2+2.056703s+1.09028}$$

Alternatively, factorizing the denominator, we have the following:

$$H(s) = \frac{0.180559s^2+2.180559}{(s+1.060221)(2s^2+1.939883s+2.056703)} = \quad (49)$$

$$\frac{0.090279s^2 + 1.09028}{(s + 1.060221)(s^2 + 0.969941s + 1.028352)}$$

The foregoing is a description of the inverse Chebychev filter. The method of obtaining the transfer function has also been indicated in general terms.

The biquad method will be described next. The biquad method performs partitioning into a first-order filter and a second-order filter, and a higher-order filter is represented by the product of the transfer functions of these filters.

The transfer characteristic $H_1(s)$ of a first-order LPF shown in FIG. 1 is expressed as follows:

$$H_1(s) = \frac{V_{out}}{V_{in}} = \frac{\frac{2g_{m1}}{C_1}}{s + \frac{2g_{m2}}{C_1}} \tag{50}$$

Figure 2:
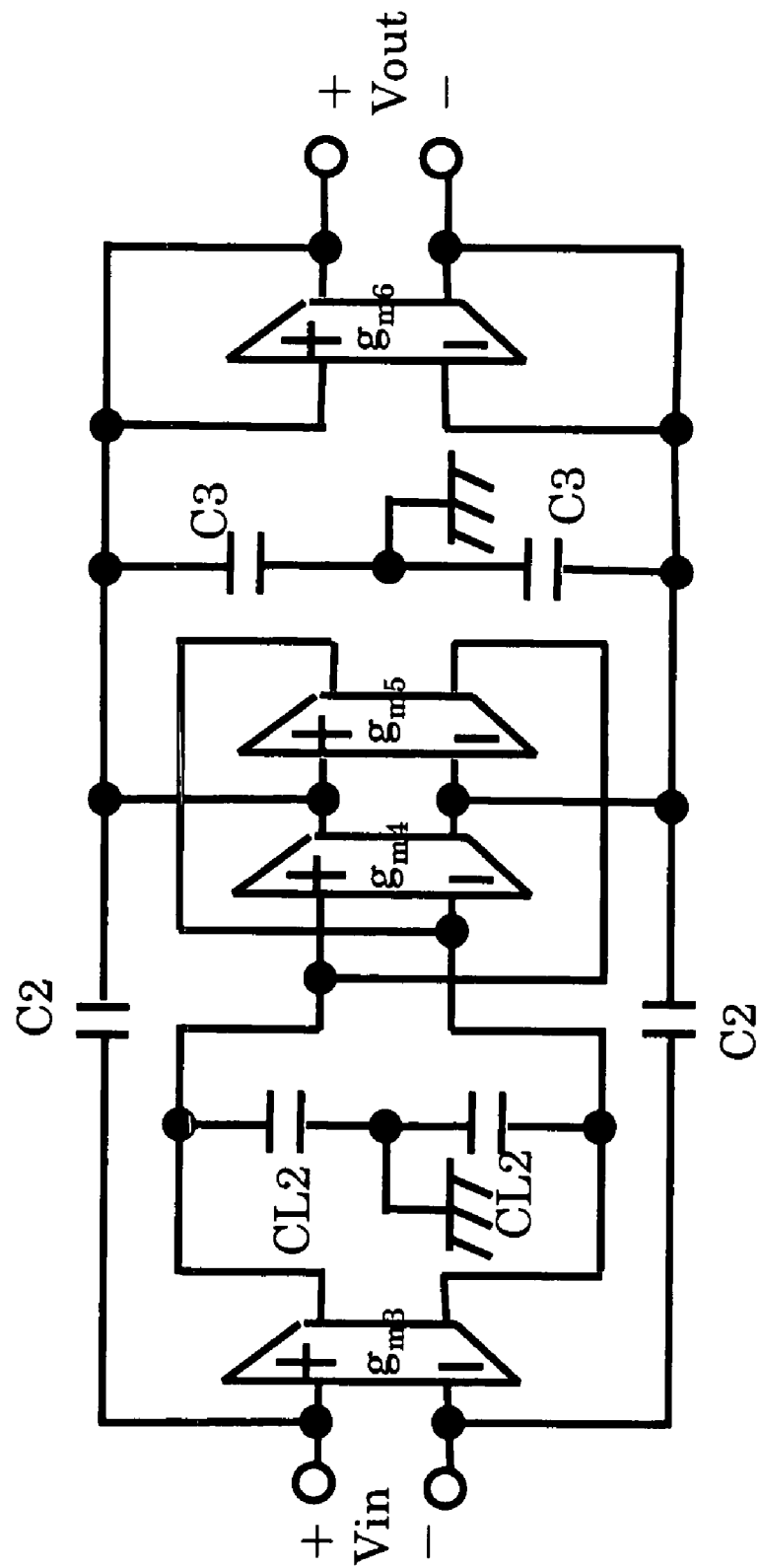
FIG. 2 is a diagram illustrating the structure of a biquad second-order elliptic gm-C LPF circuit for describing a complex filter according to the present invention.

The transfer characteristic $H_2(s)$ of a second-order biquad elliptic LPF shown in FIG. 2 is expressed as follows:

$$H_2(s) = \frac{V_{out}}{V_{in}} = \frac{\frac{C_2}{C_2 + C_3}s^2 + \frac{4g_{m3}g_{m4}}{C_{L2}(C_2 + C_3)}}{s^2 + s\frac{2g_{m6}}{C_2 + C_3} + \frac{4g_{m4}g_{m5}}{C_{L2}(C_2 + C_3)}} \tag{51}$$

Accordingly, the transfer function $H(s)$ of a third-order gm-C LPF constructed using the biquad method is expressed as follows:

$$H(s) = H_1(s) \cdot H_2(s) = \frac{\frac{2g_{m1}}{C_1}}{s + \frac{2g_{m2}}{C_1}} \cdot \frac{\frac{C_2}{C_2 + C_3}s^2 + \frac{4g_{m3}g_{m4}}{C_{L2}(C_2 + C_3)}}{s^2 + s\frac{2g_{m6}}{C_2 + C_3} + \frac{4g_{m4}g_{m5}}{C_{L2}(C_2 + C_3)}} \tag{52}$$

Figure 3:
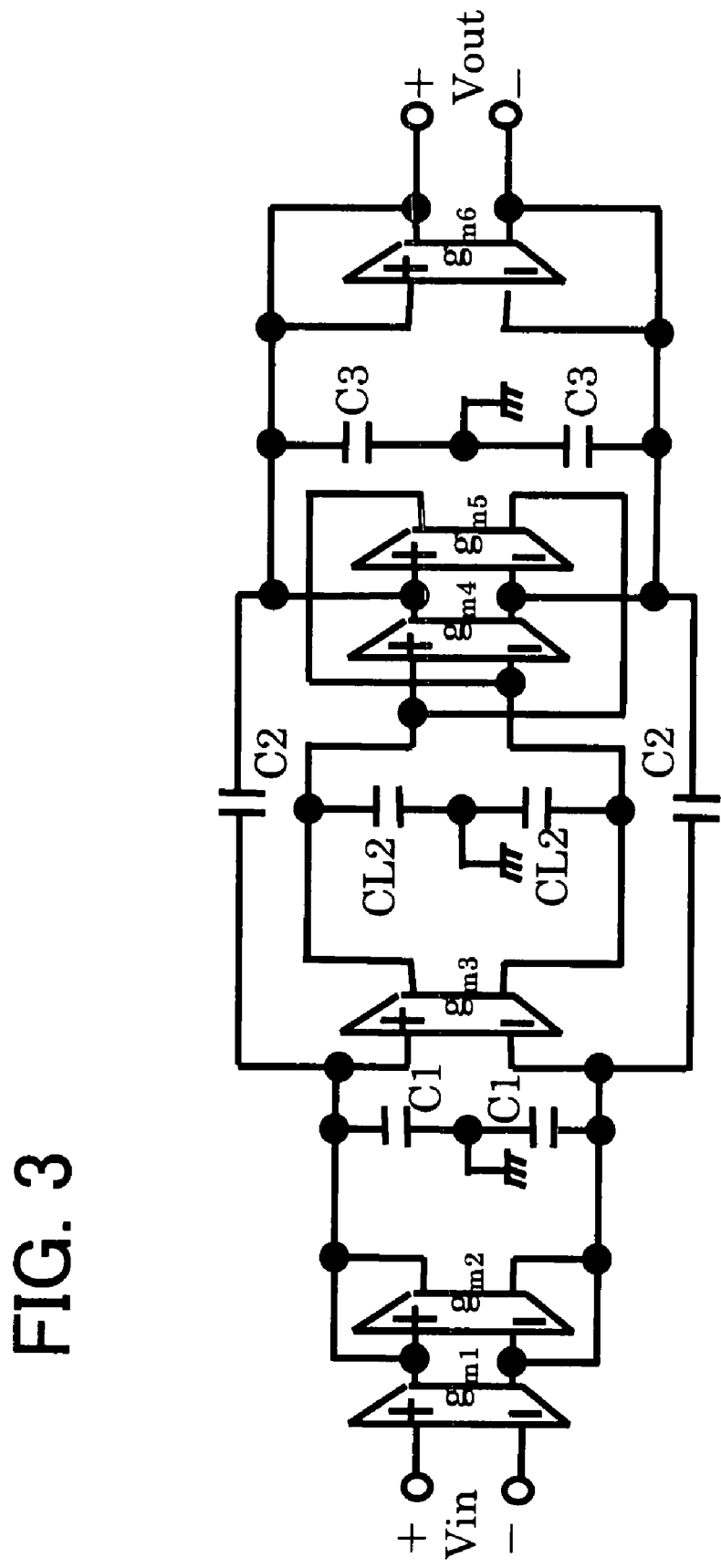
FIG. 3 is a diagram illustrating the structure of a third-order elliptic gm-C LPF circuit for describing a complex filter according to the present invention.

On the other hand, a third-order elliptic gm-C LPF constructed using the biquad method is shown in FIG. 3.

First, if the elliptic capacitor C2 is deleted, the transfer function $H(s)$ becomes as follows in the case of a doubled-ended (fully differential) arrangement:

$$H(s) = \frac{\frac{2g_{m1}}{C_1}}{s + \frac{2g_{m2}}{C_1}} \cdot \frac{\frac{4g_{m3}g_{m4}}{C_{L2}C_3}}{s^2 + \frac{2g_{m6}}{C_2 + C_3}s + \frac{4g_{m4}g_{m5}}{C_{L2}C_3}} \tag{53}$$

If $g_{m1}$ to $g_{m6}$ are equal and represented by $g_m$, then the transfer function $H(s)$ is expressed as follows in the case of the double-ended (fully differential) arrangement:

$$H(s) = \frac{1}{\frac{C_1 C_{L2} C_3}{8g_m^3}s^3 + \frac{C_{L2}}{4g_m^2}(C_1 + C_3)s^2 + \left(\frac{C_1}{2g_m} + \frac{C_{L2}}{2g_m}\right)s + 1} \tag{54}$$

In the case of an elliptic gm-C LPF onto which the elliptic filter has been added, the transfer function $H(s)$ becomes as follows for the double-ended (fully differential) arrangement:

$$H(s) = \frac{2g_{m1}(C_2 C_{L2} s^2 + 4g_{m3}g_{m4})}{C_{L2}(C_1 C_2 + C_1 C_3 + C_3 C_2)s^3 + C_{L2}(2g_{m2}C_2 + 2g_{m2}C_3 + 2g_{m6}C_1 + 2g_{m6}C_2)s^2 + (4g_{m2}g_{m6}C_{L2} + 4g_{m4}g_{m5}C_1 + 4g_{m4}g_{m5}C_2 - 4g_{m3}g_{m4}C_2)s + 8g_{m2}g_{m4}g_{m5}} \tag{55}$$

If $g_{m1}$ to $g_{m6}$ are equal and represented by $g_m$, then the transfer function $H(s)$ is expressed as follows in the case of the double-ended (fully differential) arrangement:

$$H(s) = \frac{\frac{C_2 C_{L2}}{4g_m^2}s^2 + 1}{\frac{C_{L2}(C_1 C_2 + C_1 C_3 + C_3 C_2)}{8g_m^3}s^3 + \frac{C_{L2}}{4g_m^2}(C_1 + 2C_2 + C_3)s^2 + \left(\frac{C_1}{2g_m} + \frac{C_{L2}}{2g_m}\right)s + 1} \tag{56}$$

If Equations (13) and (56) are compared, it will be seen that the numerators of these transfer functions are equal but that the first-order and third-order coefficients of the constant s in the denominator are different.

Figure 19:
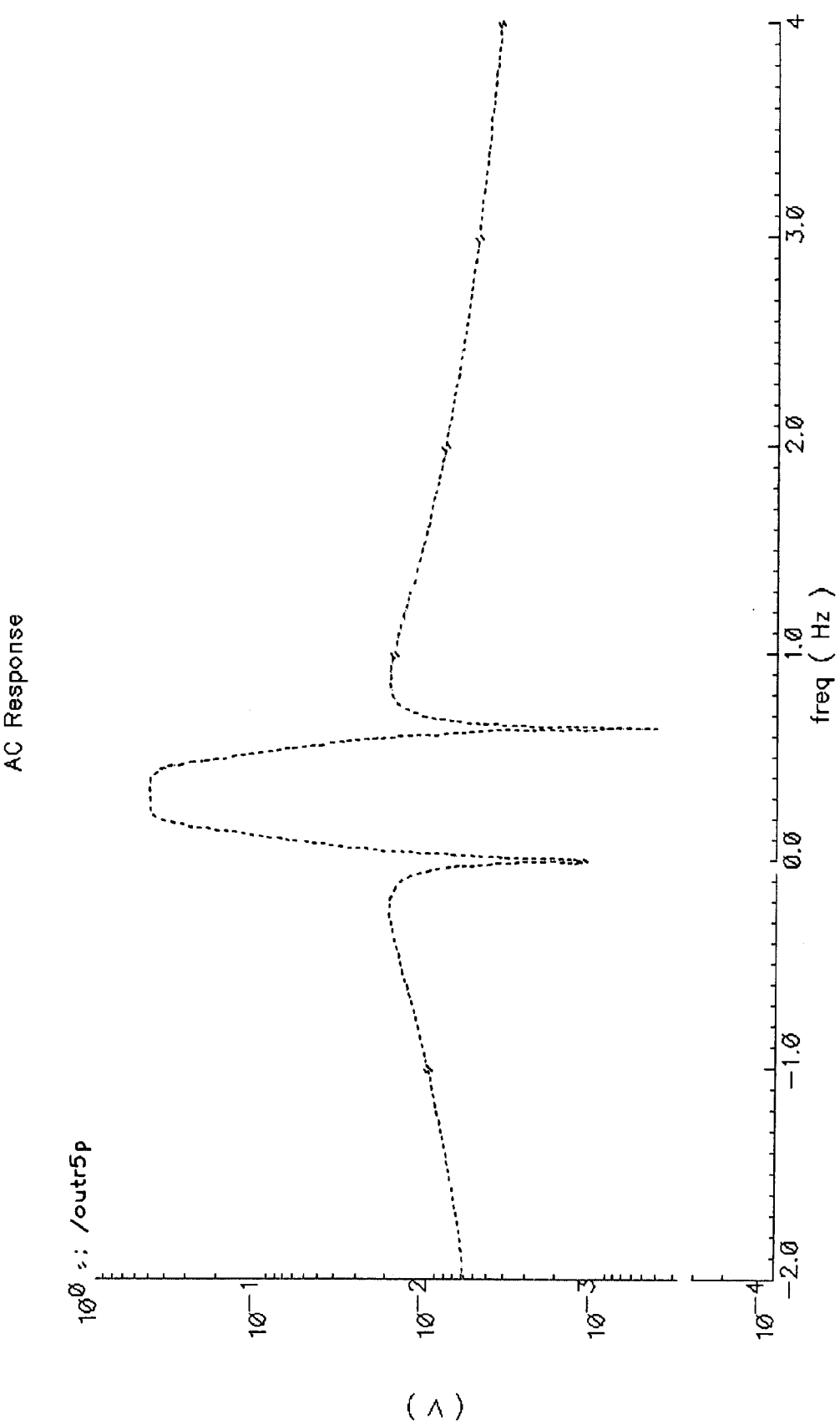
FIG. 19 is a diagram illustrating another characteristic of a simplified complex third-order inverse Chebychev filter circuit according to the present invention.

A similar disparity is seen in Equation (52) as well. This disparity is a factor that causes the filter characteristic to shift from the ideal characteristic in a case where the complex elliptic gm-C filter is constructed as shown in FIG. 19. In particular, it tends to be difficult to maintain a flat characteristic in a passband in a complex elliptic filter.

In order to solve this problem, a buffer amplifier is inserted between the first-order LPF shown in FIG. 1 and the second-order biquad elliptic LPF shown in FIG. 2 and it is so arranged that the electric charge of the elliptic capacitor will not flow into the first-order LPF of the preceding stage, thereby eliminating an adverse effects.

In a case where a practical OTA used in a single-ended arrangement, even higher-harmonic distortion of the second order and higher appears conspicuously and the OTA usually is used in the double-ended (fully differential) arrangement.

[Description of Operation]

With an inverse Chebychev filter, there is an interchange of an passband and attenuation band and therefore notation in terms of an LC ladder is not available. Accordingly, a realization method by the biquad method will be described based upon the transfer function. Equation (49) is used as the transfer function of a third-order inverse Chebychev LPF whose denominator and numerator have been factorized.

$$H(s) = \frac{0.090279s^2 + 1.09028}{(s + 1.060221)(s^2 + 0.969941s + 1.028352)} \tag{57}$$

This transfer function is resolved into a first-order LPF $$H_1(s) = \frac{1.060221}{s + 1.060221} \tag{58}$$

and a second-order elliptic LPF $$H_2(s) = \frac{0.08515111 s^2 + 1.02835164}{s^2 + 0.969941 s + 1.028352} \quad (59)$$

The transfer characteristic $H_1(s)$ of the first-order LPF shown in FIG. 1 is expressed as follows:

$$H_1(s) = \frac{V_{out}}{V_{in}} = \frac{\frac{2g_{m1}}{C_1}}{s + \frac{2g_{m2}}{C_1}} \quad (50)$$

The transfer characteristic $H_2(s)$ of the second-order biquad elliptic LPF shown in FIG. 2 is expressed as follows:

$$H_2(s) = \frac{V_{out}}{V_{in}} = \frac{\frac{C_2}{C_2 + C_3} s^2 + \frac{4 g_{m3} g_{m4}}{C_{L2}(C_2 + C_3)}}{s^2 + s \frac{2 g_{m6}}{C_2 + C_3} + \frac{4 g_{m4} g_{m5}}{C_{L2}(C_2 + C_3)}} \quad (51)$$

If the coefficients of Equations (50) and (58) are compared, we have $$\frac{2g_{m1}}{C_1} = \frac{2g_{m2}}{C_1} = 1.060221 \quad (60)$$

from which we have $g_{m1} = g_{m2}$. This is natural because the numerator in Equation (58) is made 1.060221 and is not made 1 and the coefficients of the zero order in the denominator are set to be equal.

That is, $H_1(0) = 1$ holds.

Naturally, $H_2(0) = 1$ holds.

Thus we have the following:

$$\frac{2g_{m6}}{C_2 + C_3} = 0.969941 \quad (61)$$

$$\frac{4 g_{m4} g_{m5}}{C_{L2}(C_2 + C_3)} = 1.028352 \quad (62)$$

$$\frac{C_2}{C_2 + C_3} = 0.08515111 \quad (63)$$

$$\frac{4 g_{m3} g_{m4}}{C_{L2}(C_2 + C_3)} = 1.028352 \quad (64)$$

Using $g_{m3} = g_{m4} = g_{m5} = g_{m6} = g_m$, we have the following from Equation (60):

$$C_1 = \frac{2g_m}{1.060221} = 1.886399156 \, g_m \, [F] \quad (65)$$

Equations (62) and (64) are equal. Substituting Equation (64), we have the following:

$$C_{L2} = \frac{2g_m}{\left(\frac{1.028352}{0.969941}\right)} = 1.886398821 \, g_m \, [F] \quad (66)$$

We have the following from Equation (61):

$$C_2 + C_3 = \frac{2g_m}{0.969941} = 2.06198109 \, g_m \, [F] \quad (67)$$

and from Equation (63) we have $C_2 = 0.093076693 C_3$. Therefore, we obtain the following:

$$C_3 = 1.886401112 g_m \, [F] \quad (68)$$

$$C_2 = 0.175579977 g_m \, [F] \quad (69)$$

If Equations (65), (66) and (68) are compared, it will be seen that C1:CL2:C3=1:0.9999998224:1.000001037 holds and the difference is within ±0.00002%. That is, in reality, this may be regarded as C1=CL2=C3. Here a third-order inverse Chebychev gm-C LPF that can be implemented by capacitor values that are all equal with the exception of the elliptic capacitors is obtained.

First Embodiment

In a gm-C filter, capacitance C is transformed to inductance L using a gyrator, and an LCR filter is transformed to an OTA-C filter, namely a so-called gm-C filter. However, in the case of a floating L, four OTAs and one capacitor become necessary, the number of elements is large and it is difficult to reduce circuit current.

If the above-described biquad method is used, this portion can be eliminated and four OTAs are required per second-order filter. Accordingly, this problem is particularly serious in a complex filter in which LPFs are required in the two channels of I and Q.

Figure 4:
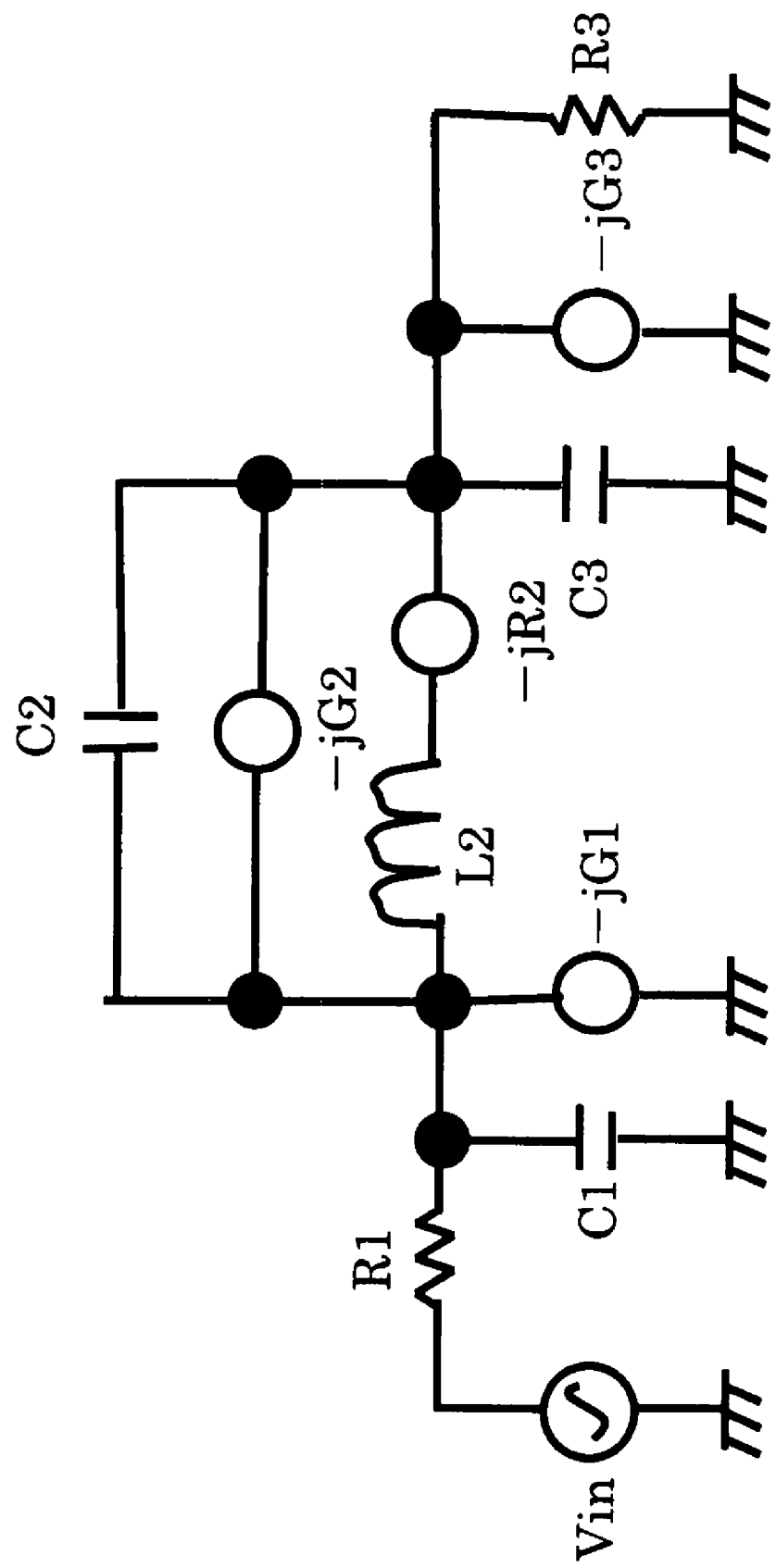
FIG. 4 is a diagram illustrating an equivalent circuit of a complex third-order filter for describing the present invention.
Figure 16:
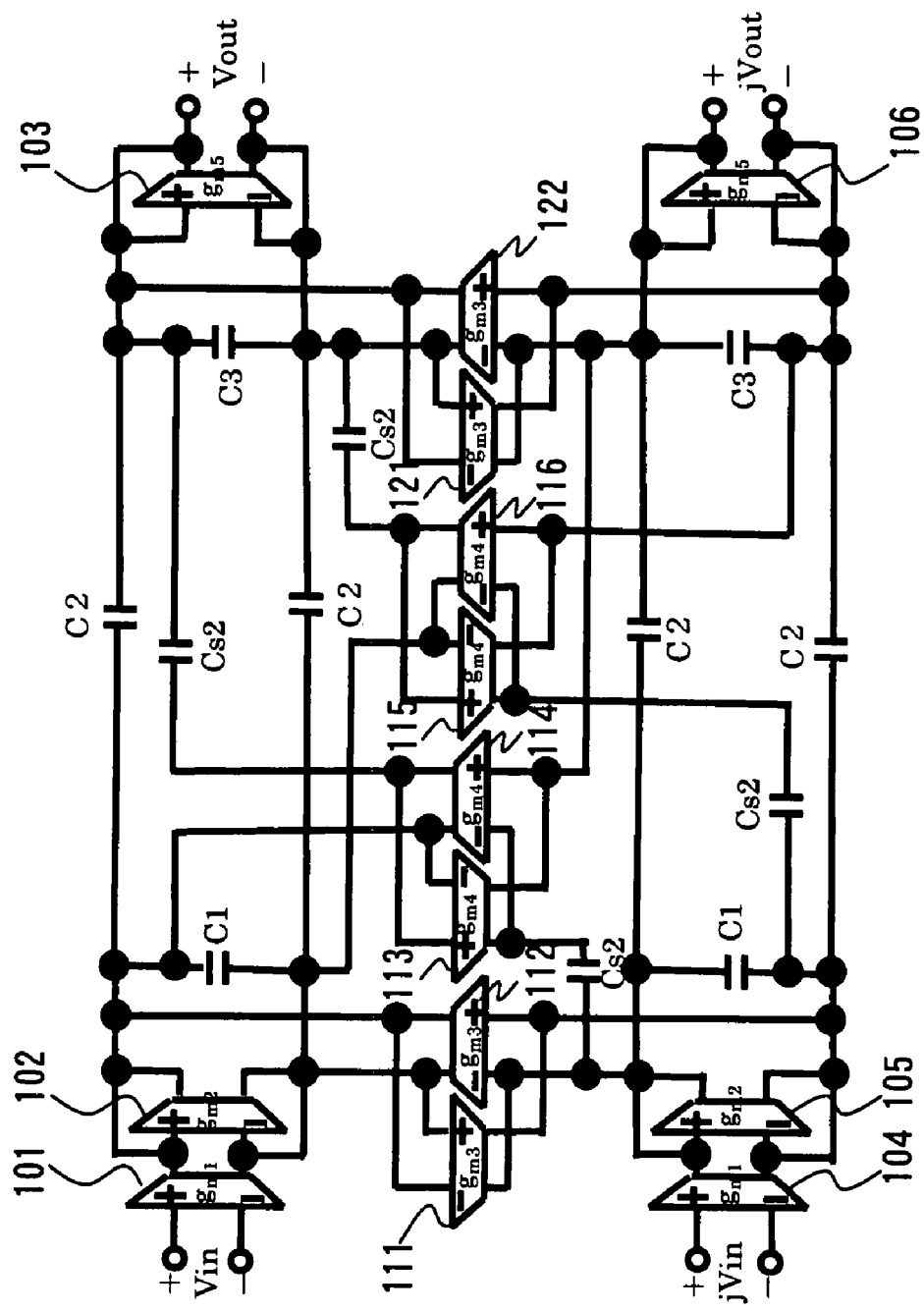
FIG. 16 is a diagram illustrating the structure of a simplified third complex third-order elliptic gm-C filter circuit according to the present invention.
Figure 17:
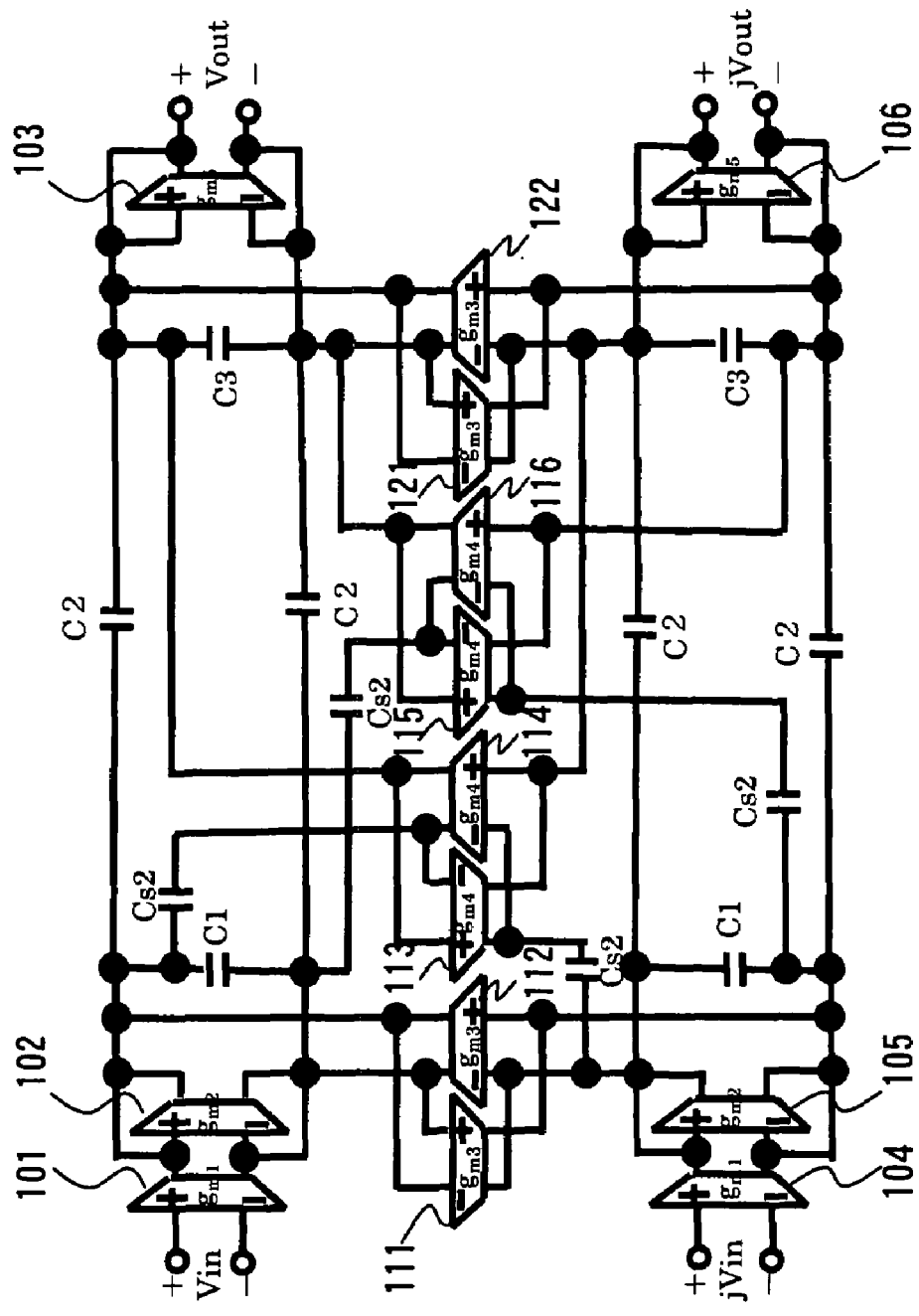
FIG. 17 is a diagram illustrating the structure of a simplified fourth complex third-order elliptic gm-C filter circuit according to the present invention.

If the elliptic RLC ladder LPF shown in FIG. 16 is transformed to a complex filter, the result will be as shown in FIG. 4.

Admittance $Y_{C2}$ of a series branch (L2, –jR2, C2, –jG2) of the complex third-order elliptic filter shown in FIG. 4 is as follows:

$$Y_{C2}(s) = \quad (70)$$
$$\frac{1}{sL_2 - jR_2} + sC_2 - jG_2 = \frac{s^2 L_2 C_2 - js(R_2 C_2 + L_2 G_2) + 1 - R_2 G_2}{sL_2 - jR_2}$$

If an admittance equivalent to $Y_{C2}(S)$ can be implemented solely by an imaginary resistance or imaginary conductance and capacitance, then substitution will be possible. In a case where a complex elliptic filter is implemented by a gm-C filter, the number of OTAs can be reduced greatly.

Admittance $Y_{S2}$ of a series branch (Cs2, –jRs2, Cp2, –jGp2) in a case where the inductance L2 is not used and is replaced by capacitance Cs2 is expressed as follows:

$$Y_{s2}(s) = \frac{1}{\frac{1}{sC_{s2}} - jR_{s2}} + sC_{p2} - jG_{p2} = \quad (71)$$

$$\frac{-js^2 R_{s2} C_{s2} C_{p2} + s(C_{s2} + C_{p2} - R_{s2} G_{p2} C_{s2}) - G_{p2}}{1 - jsR_{s2} C_{s2}}$$

Since $s=j\omega$ holds, we have the following:

$$Y_{C2}(j\omega) = \frac{j\omega^2 L_2 C_2 - j\omega(R_2 C_2 + L_2 G_2) - j(1 - R_2 G_2)}{\omega L_2 - R_2} = \quad (72)$$

$$j\left\{\omega C_2 - G_2 - \frac{1}{\omega L_2 - R_2}\right\}$$

$$Y_{s2}(j\omega) = \frac{j\omega^2 R_{s2} C_{s2} C_{p2} - j\omega(C_{s2} + C_{p2} - R_{s2} G_{p2} C_{s2}) - jG_{p2}}{\omega R_{s2} C_{s2} + 1} \quad (73)$$

$$= j\left\{\omega C_{p2} - \left(G_{p2} - \frac{1}{R_{s2}}\right) - \frac{1}{\omega R_{s2}^2 C_{s2} + R_{s2}}\right\}$$

If the coefficients are compared with regard to $\omega$ in $Y_{c2}(j\omega)$ and $Y_{s2}(j\omega)$, it will suffice if the following hold:

$$C2 = Cp2 \quad (74)$$

in the first term multiplied by $\omega$;

$$G_2 = G_{p2} - \frac{1}{R_{s2}} \quad (75)$$

in the second term serving as a constant;

$$L_2 = R_{s2}^2 C_{s2} \quad (76)$$

in the term multiplied by $\omega$ in the denominator of the third term that is a fraction; and $$R2 = -Rs2 \quad (77)$$

in the constant term of the denominator of the third term that is a fraction.

That is, an equivalent admittance is obtained in this case even if the inductance L is replaced by capacitance C.

Accordingly, transposing Equations (74) to (77), the following transformed equations are obtained:

$$Cp2 = C2 \quad (78)$$

$$Rs2 = -R2 \quad (79)$$

$$G_{p2} = G_2 - \frac{1}{R_2} \quad (80)$$

$$C_{p2} = \frac{L_2}{R_2^2} \quad (81)$$

Of course, an imaginary resistance can be realized by a coupler between I and Q capacitors, which comprises a gyrator used in a conventional complex filter. However, if the input and output of the gyrator used in the coupler are interchanged, the positive and negative signs of the resistance values of the imaginary resistance reverse.

A capacitor Cs2 is inserted in series with one of the inputs and one of the outputs of the gyrator. Although this circuit coupling is asymmetric with respect to the signal path, the method of serially inserting the capacitor Cs2 is such that the filter characteristics are even in case of gyrator→capacitor or capacitor→gyrator.

Four types of circuits shown in FIGS. 6A, 6B, 6C and 6D are available as imaginary-resistance implementation circuits.

However, in a case where emphasis in the complex BPF to be implemented is placed on a flat characteristic in a passband, as in the object of this application, these four types of imaginary-resistance implementation circuits should be the same circuit on the positive-phase side and on the negative-phase side.

In the case of 12 circuits that use imaginary resistance circuits that differ on the positive- and negative phase sides, characteristics of eight different patterns are obtained. These characteristics have a slope on the order of ±0.1% in a passband even in a SPICE simulation using ideal elements, and the slopes differ from one another between I and Q and between the positive and negative phases.

Accordingly, if the influence of element sensitivity and the effects of variations in the manufacture of the elements are taken into consideration, the same imaginary resistance circuits should be used on the sides of the positive and negative phases.

Further, in terms of layout, in the case of, e.g., a fifth-order elliptic filter, taking into consideration the influence of parasitic capacitance and the like, it is preferable to adopt a layout in such a manner that symmetry is obtained in the form gyrator→capacitor, capacitor→gyrator (or, conversely, capacitor→gyrator, gyrator→capacitor), and the circuit diagram should also be written in this manner.

Figure 6A:
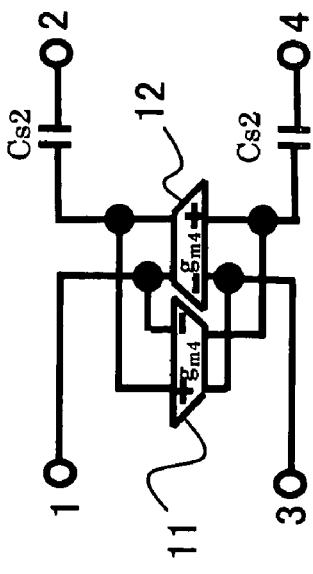
FIGS. 6A, 6B, 6C and 6D are diagrams illustrating imaginary-resistance implementation circuits.
Figure 6B:
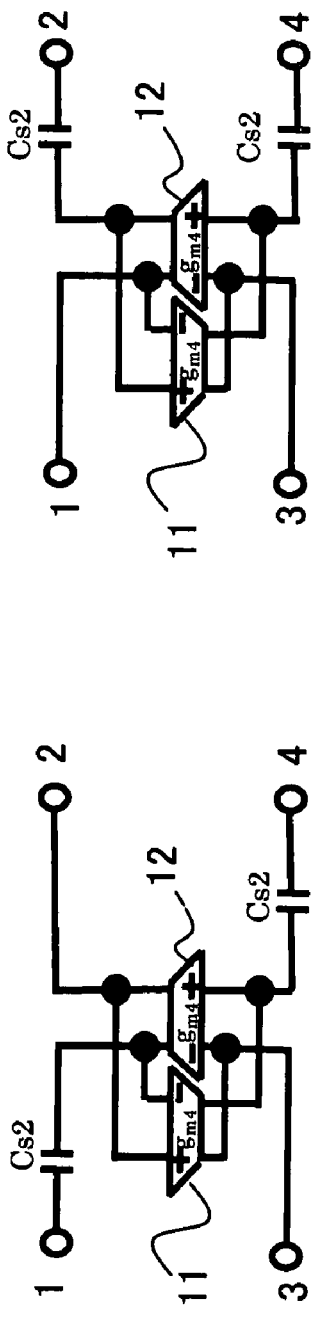
Figure 6C:
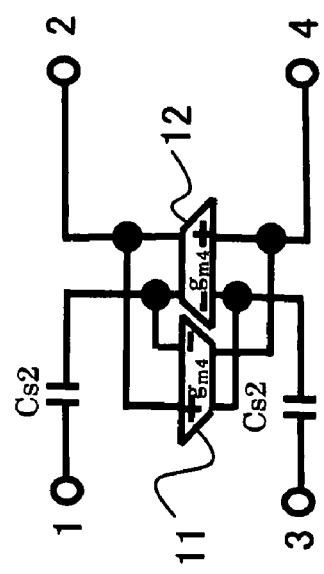
Figure 6D:
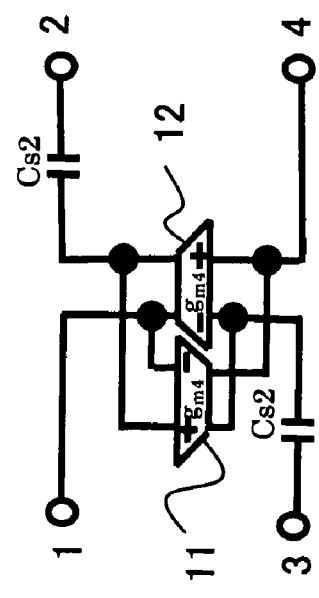

The circuit diagrams of the third-order complex filters thus implemented are 4×4 or 16 in number, in which the imaginary resistance circuits shown in FIGS. 6A, 6B, 6C and 6D are used on the positive- and negative-phase sides. As illustrated in FIG. 6A, the circuit includes OTAs 11 and 12 having their differential input terminals and differential output terminals connected together. A capacitor Cs2 is connected between the inverting input terminal (−) of the OTA 11 and a terminal 1 (on the positive-phase side), a capacitor Cs2 is connected between the non-inverting input terminal (+) of the OTA 12 and a terminal 4 (on the negative-phase side), the non-inverting input terminal (+) of the OTA 11 is connected directly to a terminal 2 (on the positive-phase side), and the inverting input terminal (−) of the OTA 12 is connected directly to a terminal 3 (on the negative-phase side). As illustrated in FIG. 6B, a capacitor Cs2 is connected between the non-inverting input terminal (+) of the OTA 11 and the terminal 2 (on the positive-phase side), a capacitor Cs2 is connected between the non-inverting input terminal (+) of the OTA 12 and the terminal 4 (on the negative-phase side), the inverting input terminal (−) of the OTA 11 is connected directly to the terminal 1 (on the positive-phase side), and the inverting input terminal (−) of the OTA 12 is connected directly to the terminal 3 (on the negative-phase side). As illustrated in FIG. 3B, a capacitor Cs2 is connected between the non-inverting input terminal (+) of the OTA 11 and the terminal 2 (on the positive-phase side), a capacitor Cs2 is connected between the non-inverting input terminal (+) of the OTA 12 and the terminal 3 (on the negative-phase side), the inverting input terminal (−) of the OTA 11 is connected directly to the terminal 1 (on the positive-phase side), and the inverting input terminal (−) of the OTA 12 is connected directly to the terminal 4 (on the negative-phase side). As shown in FIG. 6D, a capacitor Cs2 is connected between the inverting input terminal (−) of the OTA 11 and the terminal 1 (on the positive-phase side), a capacitor Cs2 is connected between the inverting input terminal (−) of the OTA 12 and the terminal 3 (on the negative-phase side), the non-inverting input terminal (+) of the OTA 11 is connected directly to the terminal 2 (on the positive-phase side), and the non-inverting input terminal (+) of the OTA 12 is connected directly to the terminal 4 (on the negative-phase side).

However, based upon the results of the SPICE simulation using ideal elements as mentioned above, in a case where there are 12 circuits that use imaginary resistance circuits that differ on the positive- and negative phase sides, characteristics of eight different patterns are obtained. These characteristics have a slope on the order of ±0.1% in a passband, and the slopes differ from one another between I and Q and between the positive and negative phases. In any case, on the positive-phase side and negative-phase side of the differential output of the complex filter, the slopes differ from each other in a passband and the values thereof are small, on the order of ±0.1%. A flat characteristic in a passband is therefore obtained as the differential output.

Accordingly, if this is utilized as the differential output, the same characteristic will be obtained even in all 16 of the circuits. However, in a case where an output of only one of the output-phase and input-phase sides is utilized, the circuits are limited to those shown in FIGS. 7, 8, 9 and 10.

FIGS. 7, 8, 9 and 10 are illustrated as representative circuit. The gyrator and capacitor can be interchanged in the admittance-transformed circuit, as mentioned above. The circuits shown in FIGS. 7, 8, 9 and 10 are all equivalent.

Figure 7:
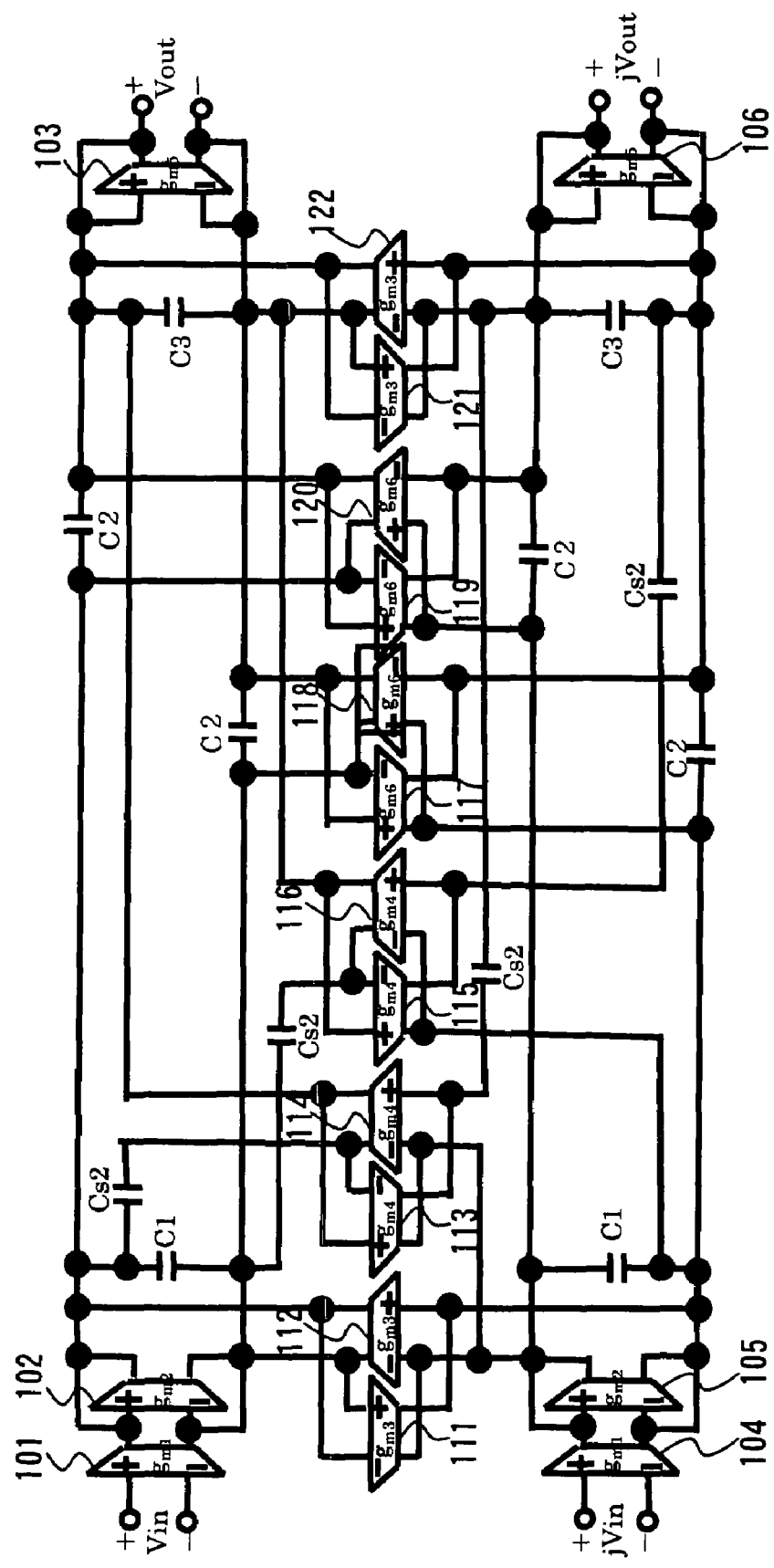
FIG. 7 is a diagram illustrating the structure of a first complex third-order elliptic gm-C filter circuit according to the present invention.

As shown in FIG. 7, the circuit includes an OTA 101 having differential signals (+, −) of an in-phase signal Vin differentially input thereto; an OTA 102 having the differential outputs of the OTA 101 differentially input thereto; and an OTA 103 whose differential inputs are connected to the commonly connected differential outputs of the OTAs 101 and 102 via positive- and negative-phase capacitors (elliptic capacitors) C2. The differential outputs and differential inputs of the OTA 103 are commonly connected to respective ones of differential signals (+, −) of Vout, and capacitors C1 and C3 are connected between the differential outputs of the OTA 102 and differential inputs of the OTA 103, respectively. The arrangement on the quadrature side (the side of the Q component) is similar. A coupler that couples the in-phase signal Vin and quadrature signal jVin has six pairs of OTAs, namely OTAs 111 and 112, OTAs 113 and 114, OTAs 115 and 116, OTAs 117 and 118, OTAs 119 and 120, and OTAs 121 and 122. Among these OTAs, the OTAs 113 and 114 have the configuration of FIG. 6A (an imaginary resistance circuit). The inverting input terminal (−) of the OTA 113 is connected to one end (positive-phase terminal) of a capacitor C1 on the in-phase side via a capacitor Cs2, the non-inverting input terminal (+) is connected to one end (positive-phase terminal) of a capacitor C3 on the in-phase side, the inverting input terminal (−) of the OTA 114 is connected to one end (positive-phase terminal) of the capacitor C1 on the quadrature side, and the non-inverting input terminal (+) is connected to one end (positive-phase terminal) of the capacitor C3 on the quadrature side via Cs2. OTAs 115 and 116 also have the configuration of FIG. 6A (an imaginary resistance circuit). The inverting input terminal (−) of the OTA 115 is connected to the other end (negative-phase terminal) of the capacitor C1 on the in-phase side via the capacitor Cs2, the non-inverting input terminal (+) is connected to the other end (negative-phase terminal) of the capacitor C3 on the in-phase side, the inverting input terminal (−) of the OTA 116 is connected to the other end (negative-phase terminal) of the capacitor C1 on the quadrature side, and the non-inverting input terminal (+) is connected to the other end (negative-phase terminal) of the capacitor C3 on the quadrature side via the capacitor Cs2. The differential inputs of the OTAs 111 and 112 are connected to both ends of respective ones of the negative-phase capacitors C2 on the in-phase and quadrature sides, and the differential inputs of the OTAs 119 and 120 are connected to both ends of respective ones of the positive-phase capacitors C2 on the in-phase and quadrature sides. The differential inputs of the OTAs 121 and 122 are connected to both ends of respective ones of the capacitors C3 on the in-phase and quadrature sides.

Figure 8:
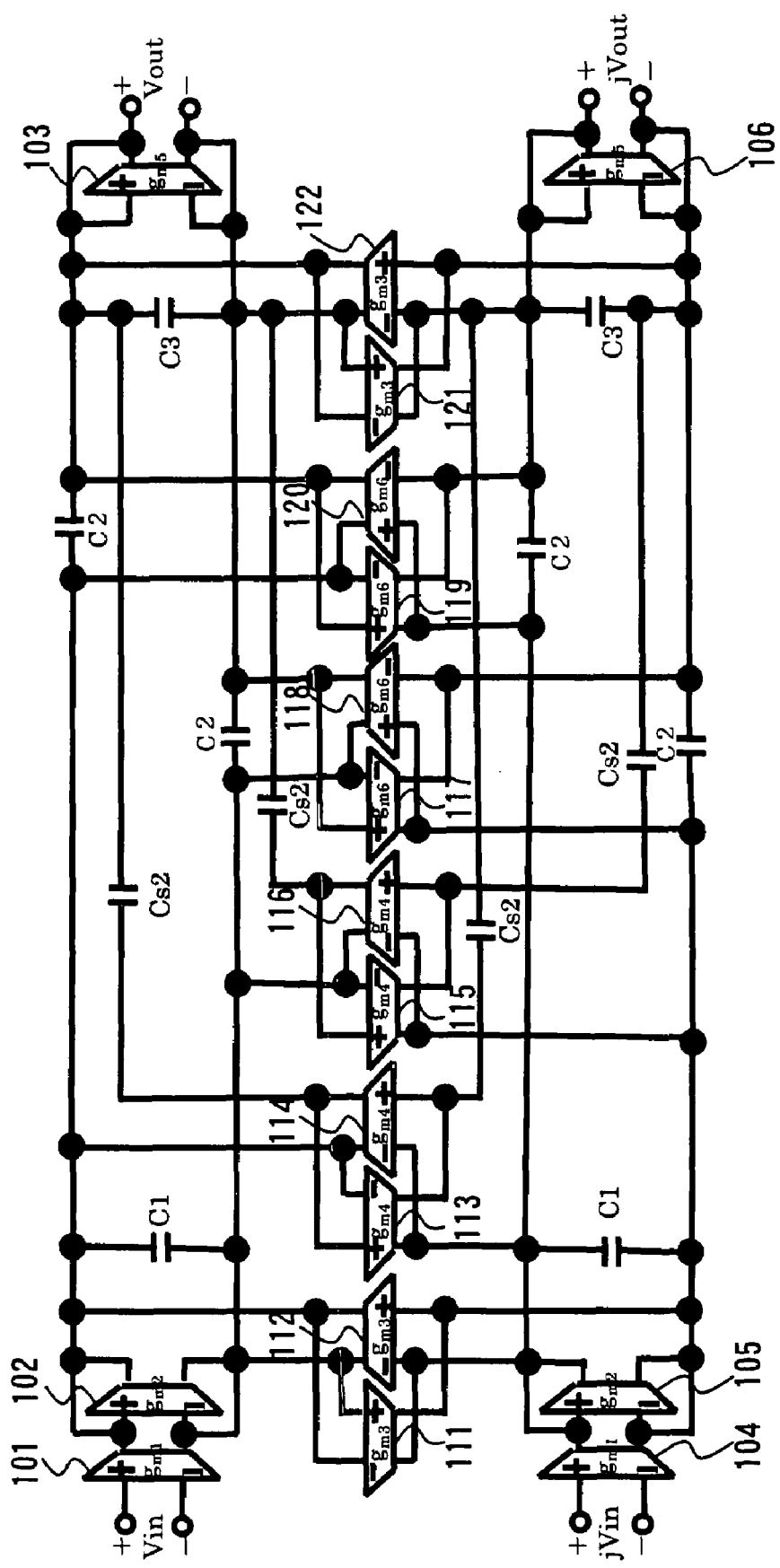
FIG. 8 is a diagram illustrating the structure of a second complex third-order elliptic gm-C filter circuit according to the present invention.

In the arrangement illustrated in FIG. 8, the OTAs 113 and 114 have the configuration of FIG. 6B (an imaginary resistance circuit). The inverting input terminal (−) of an OTA 113 is connected to one end (positive-phase terminal) of the capacitor C1 on the in-phase side, the non-inverting input terminal (+) is connected to one end (positive-phase terminal) of the capacitor C3 on the in-phase side via the capacitor Cs2, the inverting input terminal (−) of the OTA 114 is connected to one end (positive-phase terminal) of the capacitor C1 on the quadrature side, and the non-inverting input terminal (+) is connected to one end (positive-phase terminal) of the capacitor C3 on the quadrature side via the capacitor Cs2. OTAs 115 and 116 also have the configuration of FIG. 6B (an imaginary resistance circuit). The inverting input terminal (−) of the OTA 115 is connected to the other end (negative-phase terminal) of the capacitor C1 on the in-phase side, the non-inverting input terminal (+) is connected to the other end (negative-phase terminal) of the capacitor C3 on the in-phase side via the capacitor Cs2, the inverting input terminal (−) of the OTA 116 is connected to the other end (negative-phase terminal) of the capacitor C1 on the quadrature side, and the non-inverting input terminal (+) is connected to the other end (negative-phase terminal) of the capacitor C3 on the quadrature side via the capacitor Cs2. The connection configurations of the other OTA pairs are similar to that of FIG. 7.

Figure 9:
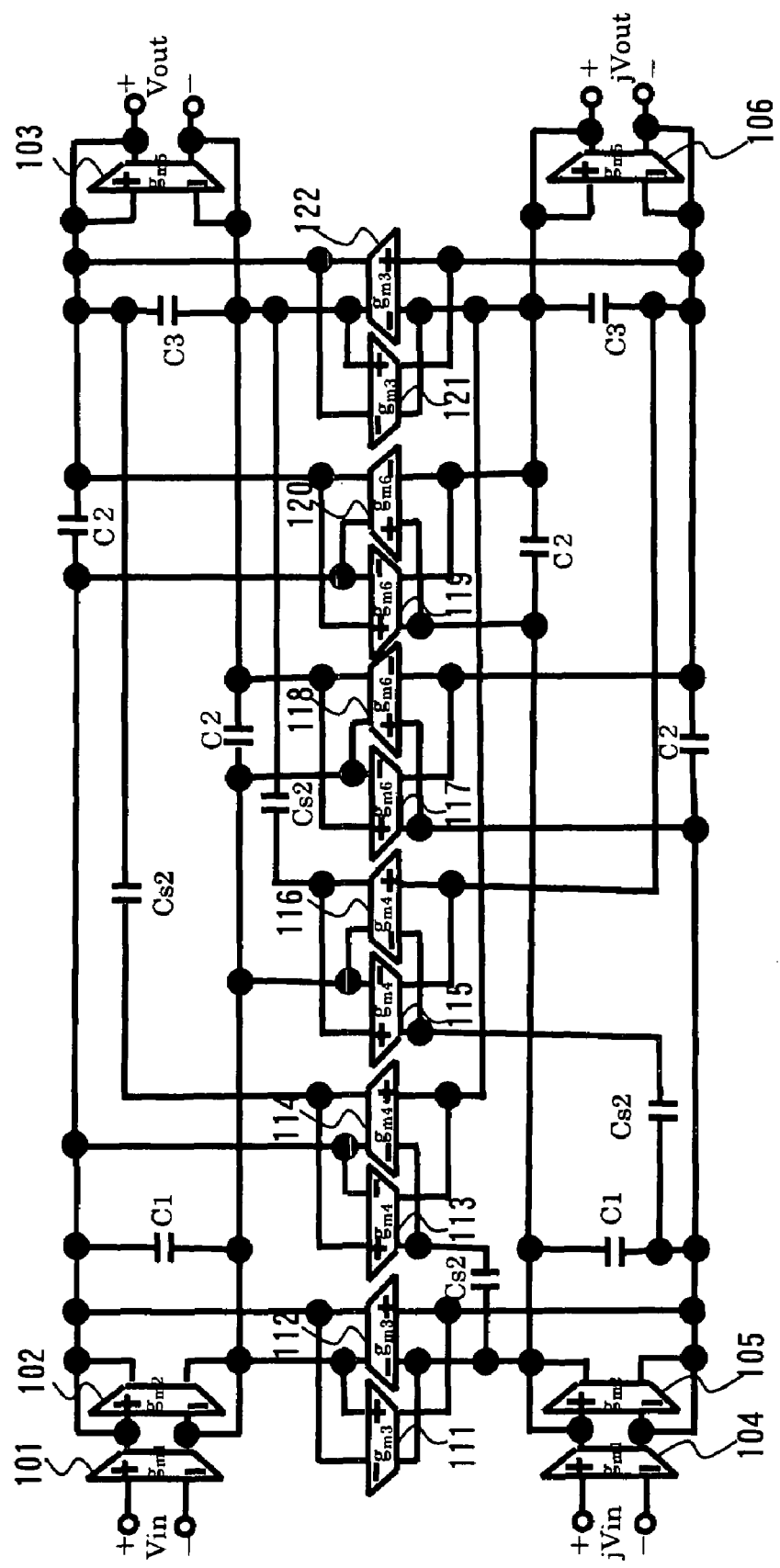
FIG. 9 is a diagram illustrating the structure of a third complex third-order elliptic gm-C filter circuit according to the present invention.

In the arrangement illustrated in FIG. 9, the OTAs 113 and 114 have the configuration of FIG. 6C (an imaginary resistance circuit). The inverting input terminal (−) of the OTA 113 is connected to one end (positive-phase terminal) of a capacitor C1 on the in-phase side, the non-inverting input terminal (+) is connected to one end (positive-phase terminal) of a capacitor C3 on the in-phase side via a capacitor Cs2, the inverting input terminal (−) of the OTA 114 is connected to one end (positive-phase terminal) of the capacitor C1 on the quadrature side via the capacitor Cs2, and the non-inverting input terminal (+) is connected to one end (positive-phase terminal) of the capacitor C3 on the quadrature side. OTAs 115 and 116 also have the configuration of FIG. 6C (an imaginary resistance circuit). The inverting input terminal (−) of the OTA 115 is connected to the other end (negative-phase terminal) of the capacitor C1 on the in-phase side, the non-inverting input terminal (+) is connected to the other end (negative-phase terminal) of a capacitor C3 on the in-phase side via the capacitor Cs2, the inverting input terminal (−) of the OTA 116 is connected to the other end (negative-phase terminal) of the capacitor C1 on the quadrature side via the capacitor Cs2, and the non-inverting input terminal (+) is connected to the other end (negative-phase terminal) of the capacitor C3 on the quadrature side. The connection configurations of the other OTA pairs are similar to that of FIG. 7.

Figure 10:
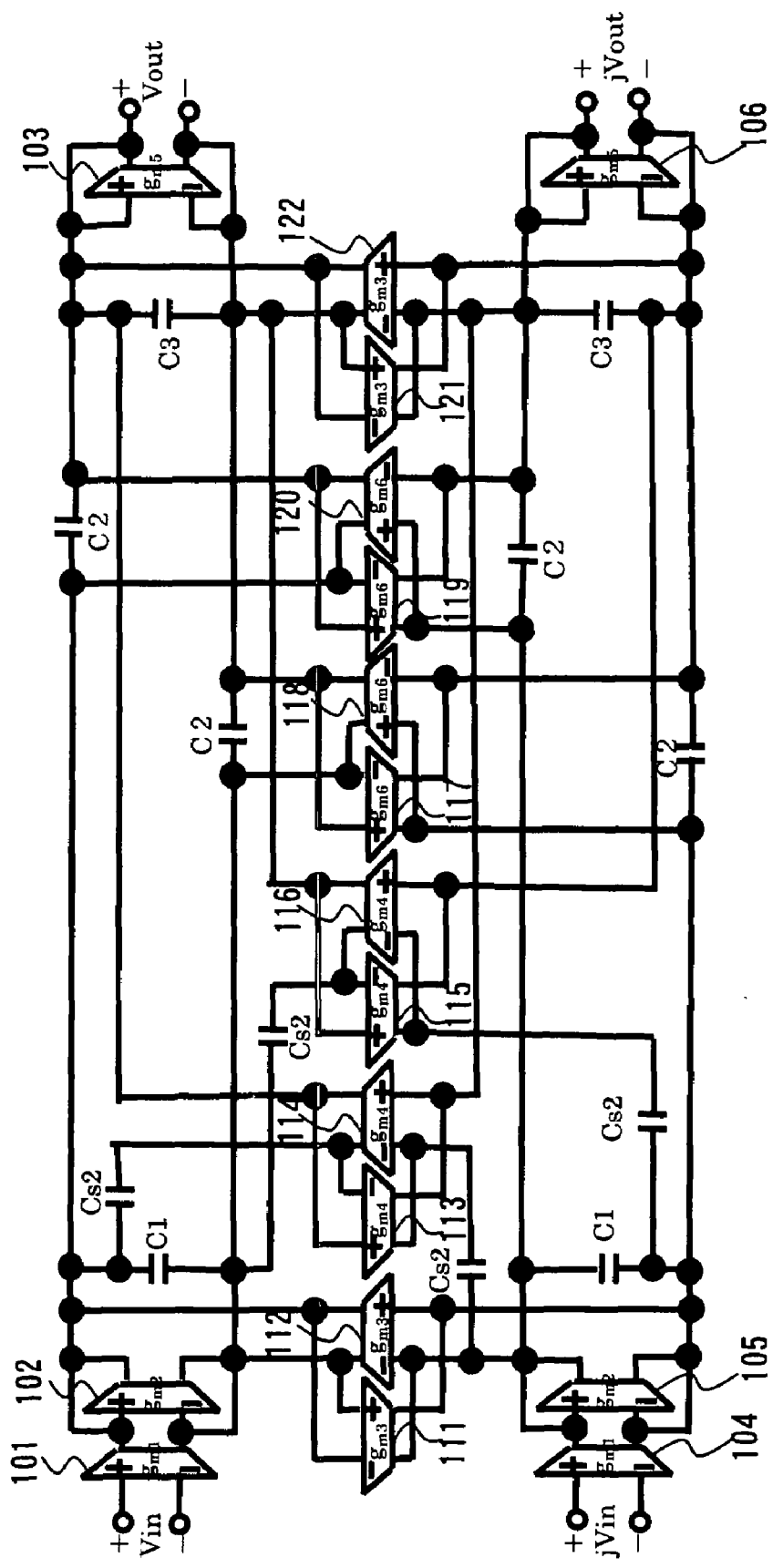
FIG. 10 is a diagram illustrating the structure of a first complex fourth-order elliptic gm-C filter circuit according to the present invention.

In the arrangement illustrated in FIG. 10, the OTAs 113 and 114 have the configuration of FIG. 6D (an imaginary resistance circuit). The inverting input terminal (−) of the OTA 113 is connected to one end (positive-phase terminal) of a capacitor C1 on the in-phase side via a capacitor Cs2, the non-inverting input terminal (+) is connected to one end (positive-phase terminal) of a capacitor C3 on the in-phase side, the inverting input terminal (−) of the OTA 114 is connected to one end (positive-phase terminal) of the capacitor C1 on the quadrature side via a capacitor Cs2, and the non-inverting input terminal (+) is connected to one end (positive-phase terminal) of a capacitor C3 on the quadrature side. OTAs 115 and 116 also have the configuration of FIG. 6D (an imaginary resistance circuit). The inverting input terminal (−) of the OTA 115 is connected to the other end (negative-phase terminal) of a capacitor C1 on the in-phase side via a capacitor Cs2, the non-inverting input terminal (+) is connected to the other end (negative-phase terminal) of a capacitor C3 on the in-phase side via the capacitor Cs2, the inverting input terminal (−) of the OTA 116 is connected to the other end (negative-phase terminal) of the capacitor C1 on the quadrature side via the capacitor Cs2, and the non-inverting input terminal (+) is connected to the other end (negative-phase terminal) of the capacitor C3 on the quadrature side.

Figure 5:
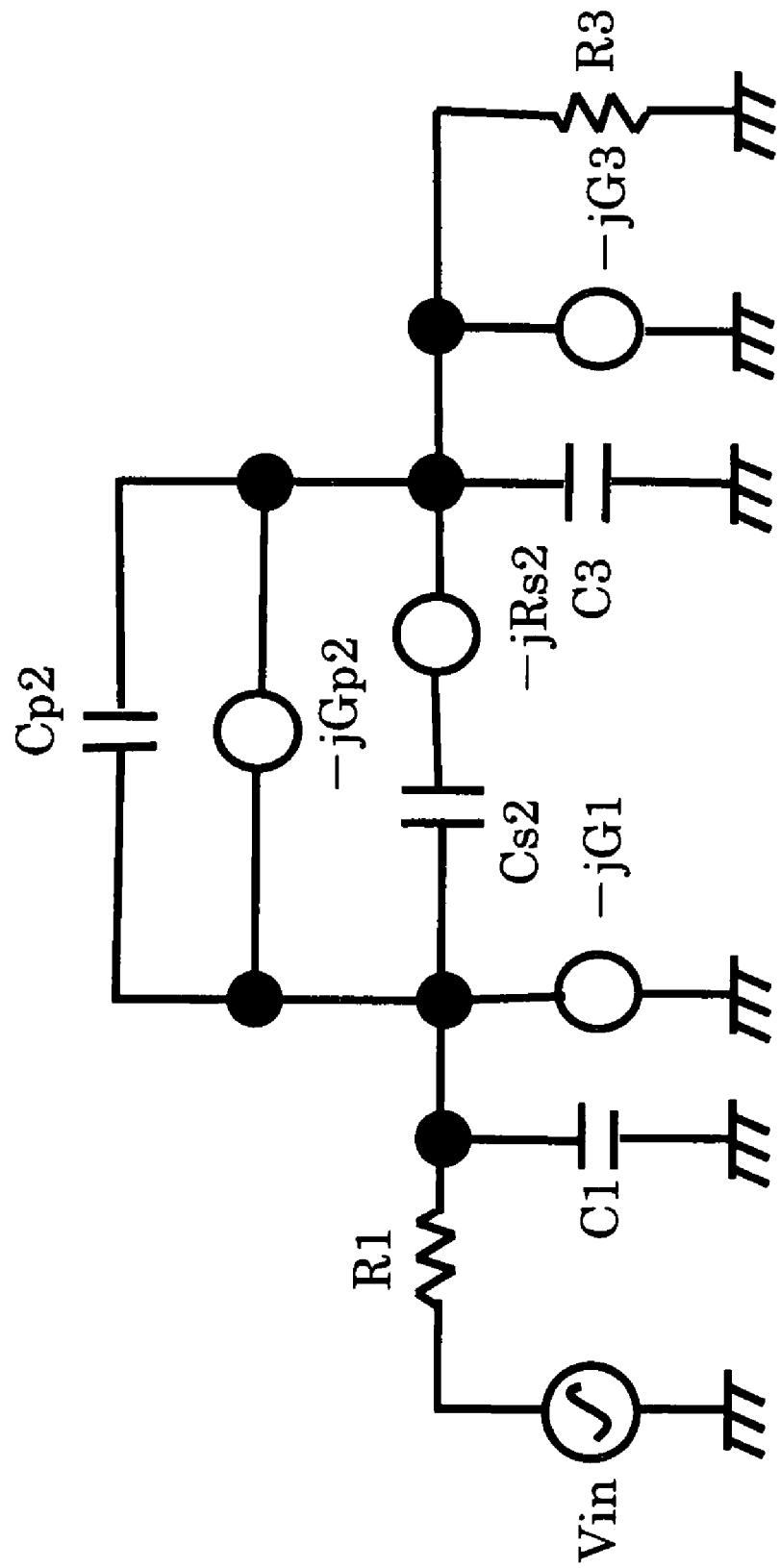
FIG. 5 is a diagram illustrating an equivalent circuit of an admittance-transformed complex third-order filter used in a complex filter circuit according to the present invention.

This is ascribable to the fact that there is equivalence even if Cs2 and −jRs2 are interchanged in FIG. 5. However, in the 12 circuits which are other than those in which the gyrator and capacitor are interchanged at different positions on the positive- and negative-phase side, it is conceivable that a very small relative error on the order of ±0.1% occurs.

In an elliptic capacitor coupler between imaginary resistors or I and Q capacitors, a differential-input/differential-out type OTA is required as the OTA used. Although a gm-C filter can be constructed even by a differential-input/single-output type OTA, a differential-input/differential-output OTA should be applied as illustrated above in the sense that the OTA circuit topologies can be coordinated and in the sense that the above-mentioned effects of the distorted characteristic of the OTA are reduced.

Although FIGS. 7, 8, 9 and 10 illustrate the case of a complex third-order elliptic filter, the arrangement is also applicable to a complex third-order inverse Chebychev filter.

For example, if this is applied to the case of a complex third-order inverse Chebychev filter, then, in a case where the former third-order inverse Chebychev filter is implemented using the biquad method, conditions for a case where the values of the capacitors C1, CL2, and C3 become equal could be applied with regard to the element constants, as described above.

However, if the configuration shown in FIGS. 7, 8, 9, or 10 is applied, the gm value of the coupler between the I and Q capacitors of C1 and C3 is doubled (gm3=1), whereas the gm value of the OTA is gm1=gm2=gm5=½. Furthermore, the gm value of the gyrator is halved (gm4=1) owing to the present admittance transformation.

On the other hand, whereas the capacitor value is C1=C3=¼, we have Cs2=¹⁄₁₆, which is one quarter, owing to the present admittance transformation.

Thus, though the values of both the gm value and capacitor value are enlarged, the increase stops at whole-number multiples 2 and 4.

Thus, an advantage is that in a case where the element parameter value is a comparatively small whole-number multiple, implementation is possible while the ratio between the element parameter values maintains a fairly good accuracy.

Figure 11:
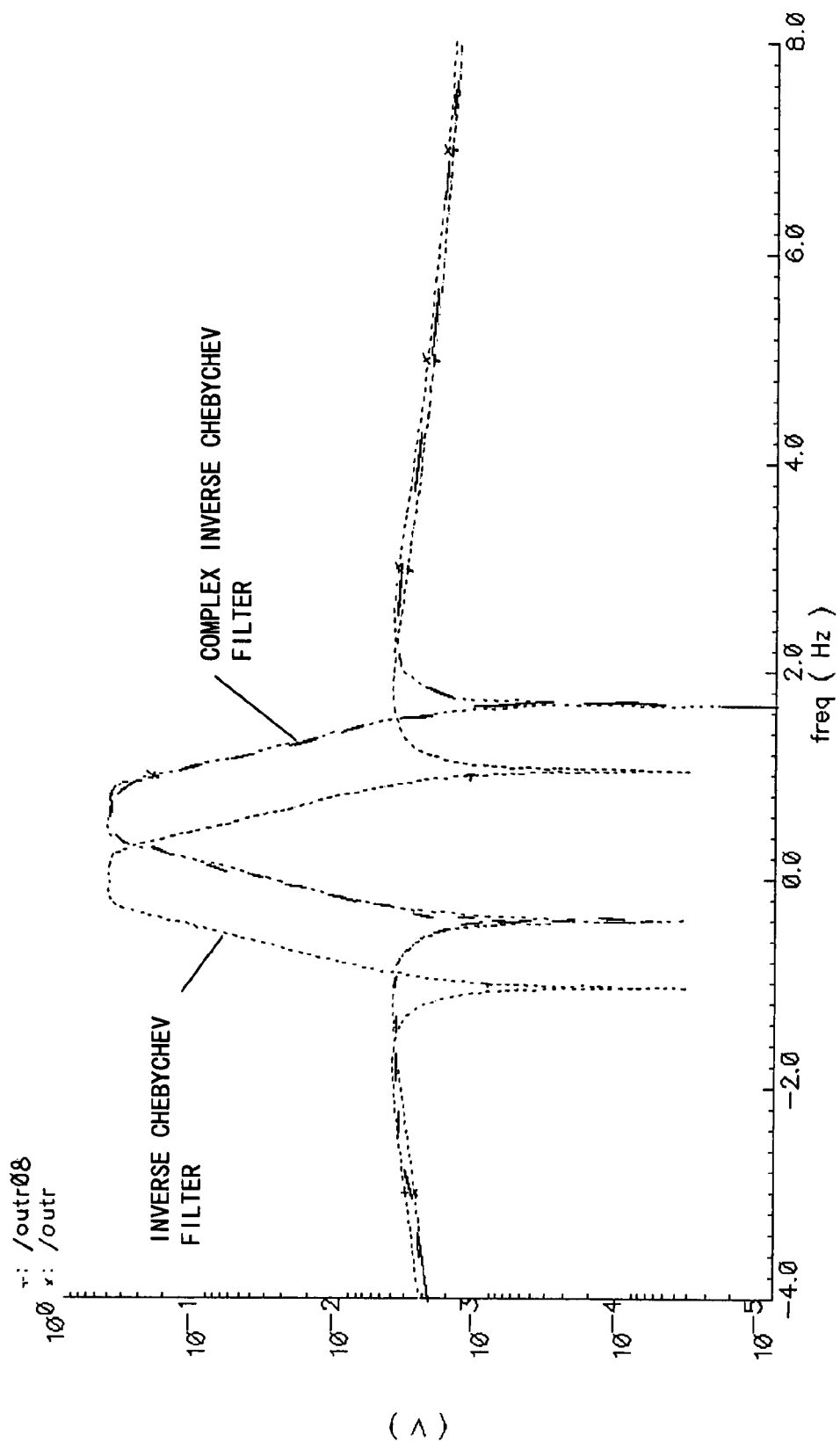
FIG. 11 is a diagram illustrating the characteristic of a complex third-order inverse Chebychev filter circuit according to the present invention and the characteristic of an former third-order inverse Chebychev filter circuit.

The characteristic of a complex third-order inverse Chebychev filter in this case is illustrated in FIG. 11 together with the former third-order inverse Chebychev filter.

Second Embodiment

As illustrated in the first embodiment, the elliptic capacitor and the gm value of the coupler between the I and Q capacitors must take on fractional values of C2=¹⁄₄₃, gm6=0.157, respectively.

For the purpose of simplifying the circuitry, it is necessary to consider eliminating the coupler of the elliptic capacitors between I, Q and also the elliptic capacitor.

The coupler of the elliptic capacitors between the I, Q capacitors operates in such a manner that the transmission zero point of the complex filter on the low-frequency side thereof will become a point on the negative (minus) side.

Further, the transmission zero point always appears on the side of low frequency owing to the admittance transformation.

It will be understood from FIG. 11 that if a frequency shift $\omega_0$ along the frequency axis can be set at will, then there will be no problem even if the transmission zero point of the complex filter on the low-frequency side thereof is zero frequency.

However, in a case where the passband is broad with respect to the frequency shift $\omega_0$ along the frequency axis, it will no longer be possible to assure the desired amount of filter attenuation. Here a case where the passband is halved will be described.

Figure 12:
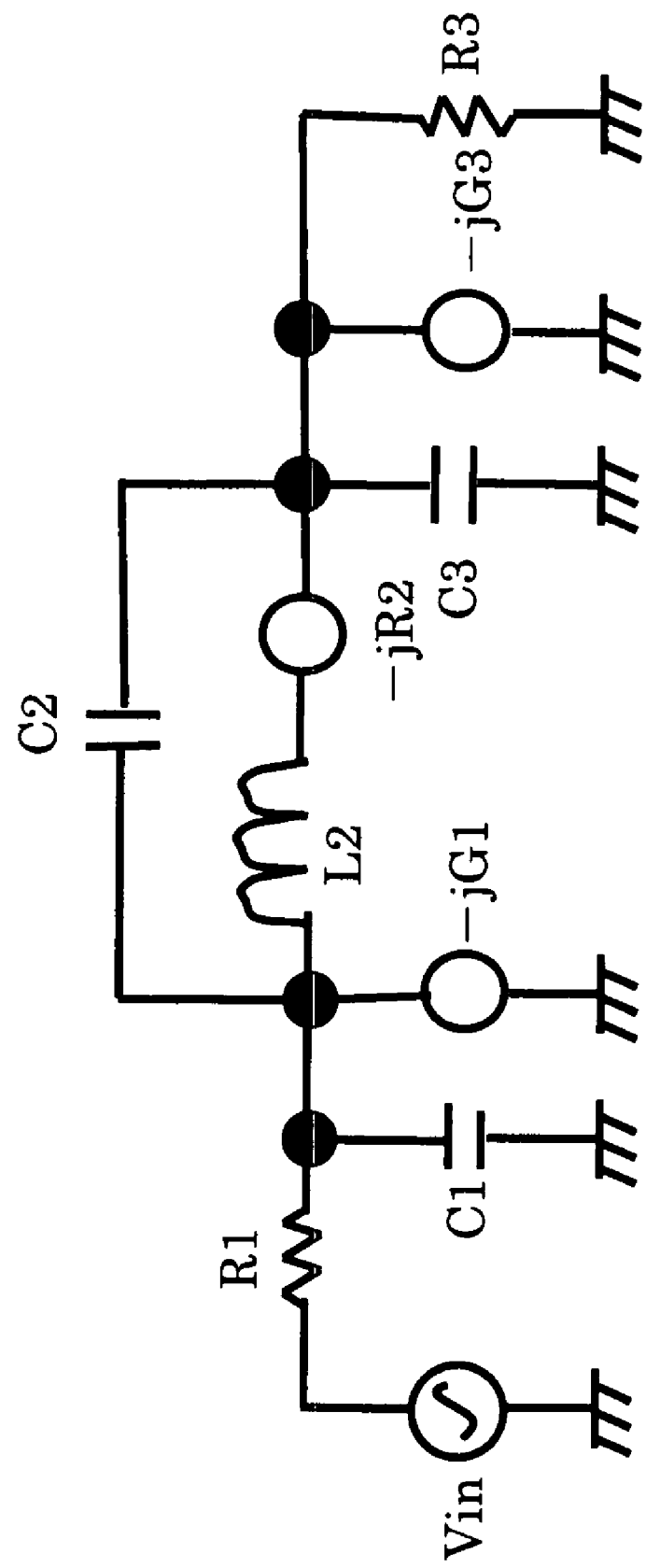
FIG. 12 is a diagram illustrating an equivalent circuit of a complex third-order filter from which a complex inductance has been eliminated for describing the present invention.

If −jG2 is deleted from the series branch (L2, −jR2, C2, −jG2) of the complex third-order elliptic filter shown in FIG. 4, the result is as shown in FIG. 12.

Admittance $Y_{C2}'$ of the series branch (L2, −jR2, C2) of the complex third-order elliptic filter in this case is as follows:

$$Y'_{C2}(s) = \frac{1}{sL_2 - jR_2} + sC_2 = \frac{s^2 L_2 C_2 - jsR_2 C_2 + 1}{sL_2 - jR_2} \quad (82)$$

If an admittance equivalent to $Y_{C2}'(s)$ can be implemented solely by an imaginary resistance or imaginary conductance and capacitance, then substitution will be possible. In a case where a complex elliptic filter is implemented by a gm-C filter, the number of OTAs can be reduced greatly.

Figure 13:
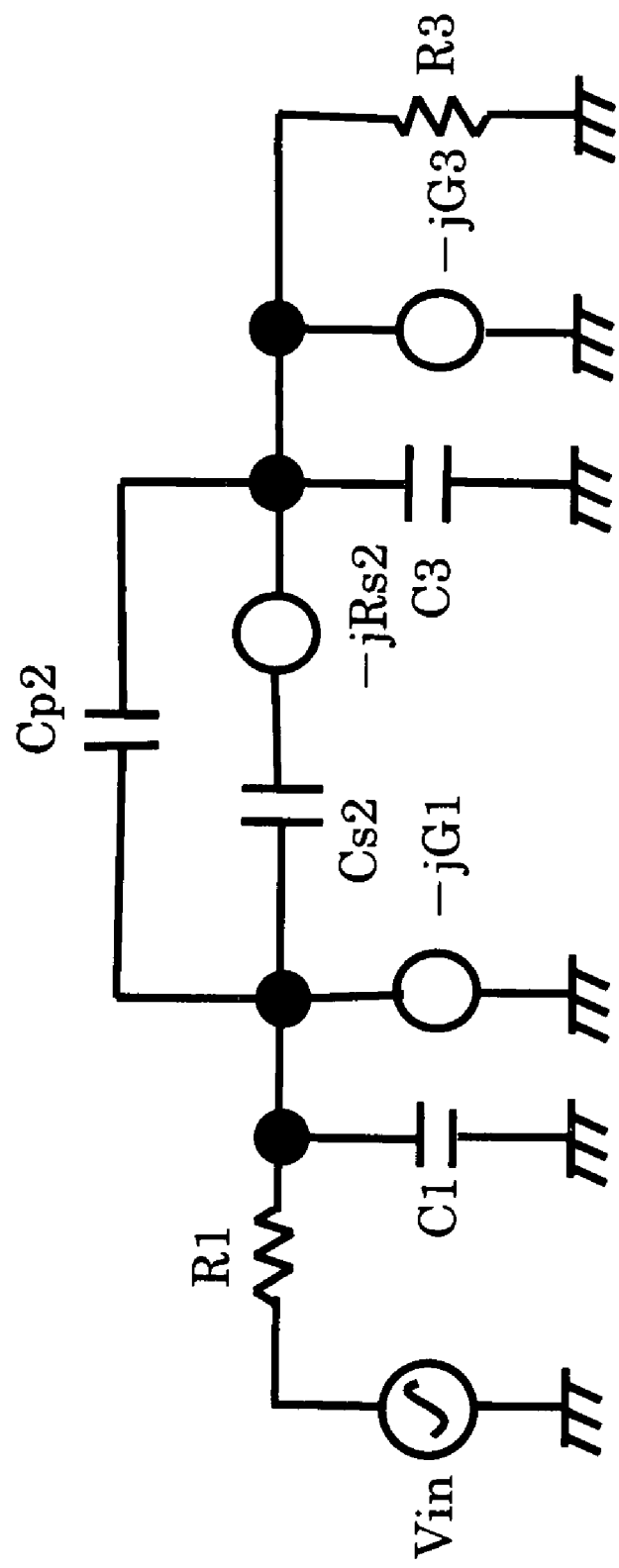
FIG. 13 is a diagram illustrating an equivalent circuit of an admittance-transformed complex third-order filter used in a complex filter circuit from which a complex conductance has been eliminated according to the present invention.
Figure 14:
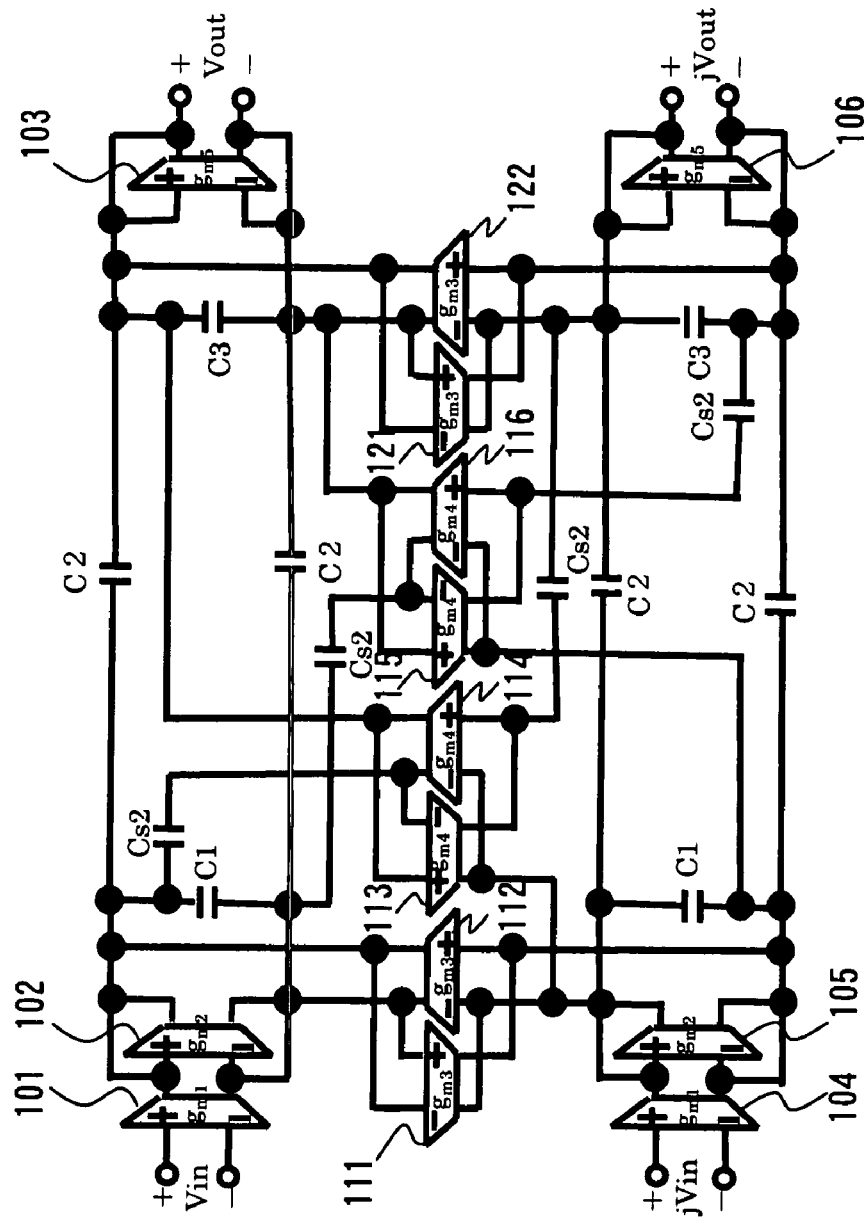
FIG. 14 is a diagram illustrating the structure of a simplified first complex third-order elliptic gm-C filter circuit according to the present invention.
Figure 15:
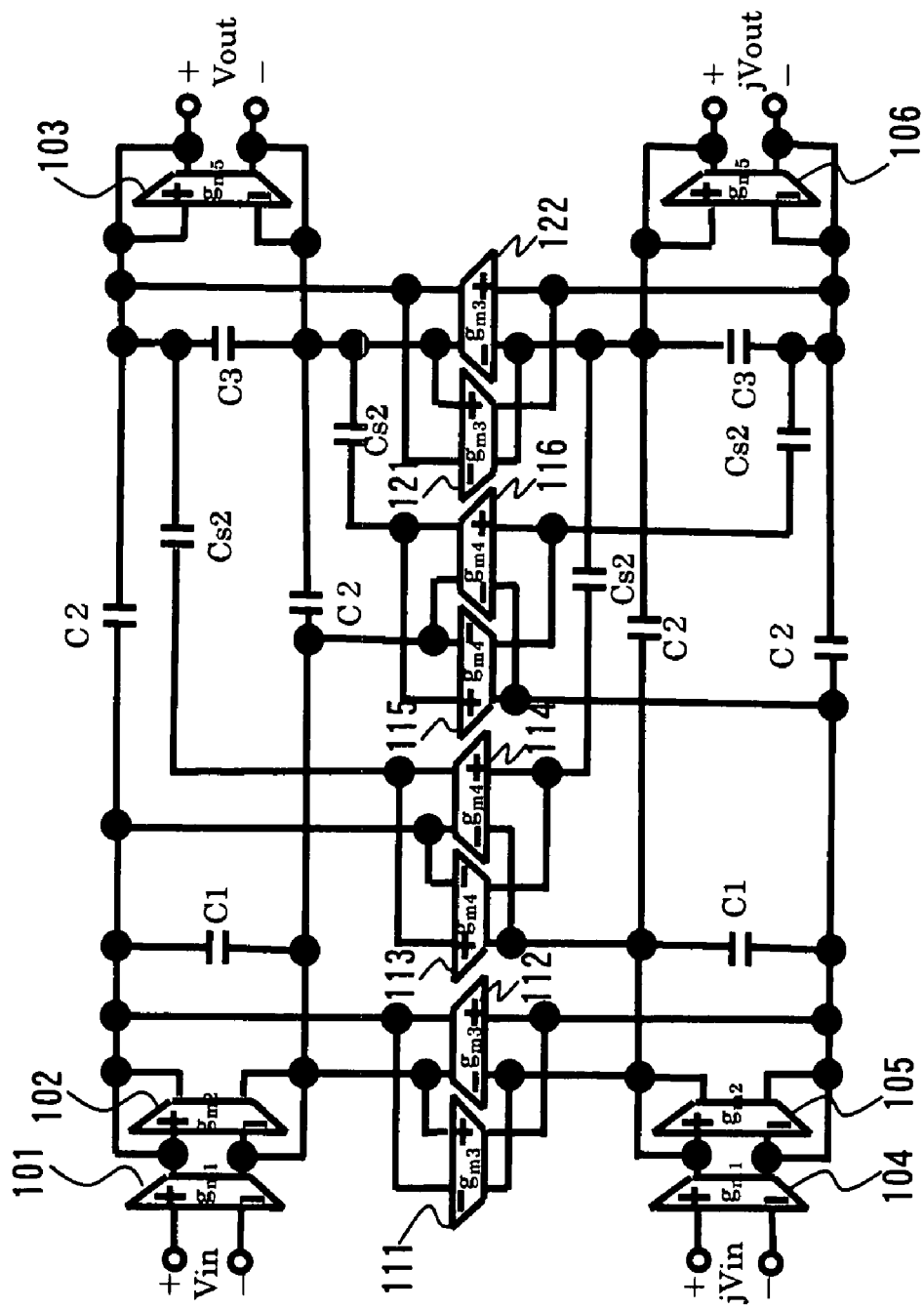
FIG. 15 is a diagram illustrating the structure of a simplified second complex third-order elliptic gm-C filter circuit according to the present invention.

As illustrated in FIG. 13, admittance $Y_{S2}'$ of the series branch (Cs2, −jRs2, Cp2) in a case where the inductance L2 is not used and is replaced by capacitor Cs2 is expressed as follows:

$$Y'_{s2}(s) = \quad (83)$$

$$\frac{1}{\frac{1}{sC_{s2}} - jR_{s2}} + sC_{p2} = \frac{-js^2 R_{s2} C_{s2} C_{p2} + s(C_{s2} + C_{p2})}{1 - jsR_{s2} C_{s2}}$$

Since $s=j\omega$ holds, we have the following:

$$Y'_{C2}(j\omega) = \frac{j\omega^2 L_2 C_2 - j\omega R_2 C_2 - j}{\omega L_2 - R_2} = j\left\{\omega C_2 - \frac{1}{\omega L_2 - R_2}\right\} \quad (84)$$

-continued $$Y'_{s2}(j\omega) = \frac{j\omega^2 R_{s2} C_{s2} C_{p2} + j\omega(C_{s2} + C_{p2})}{\omega R_{s2} C_{s2} + 1} \quad (85)$$

$$= j\left\{\left(\omega C_{p2} - \frac{1}{R_{s2}}\right) - \frac{1}{\omega R_{s2}^2 C_{s2} + R_{s2}}\right\}$$

If the coefficients are compared with regard to ω in $Y_{c2}'$ (jω) and $Y_{s2}'$ (jω), it will suffice if the following hold:

$$C_2 = C_{p2} - \frac{1}{R_{s2}} \quad (86)$$

in the first term multiplied by ω;

$$L_2 = R_{s2}^2 C_{s2} \quad (87)$$

in the term multiplied by ω in the denominator of the second term that is a fraction; and $$R2 = -Rs2 \quad (88)$$

in the constant term of the denominator of the second term that is a fraction.

That is, an equivalent admittance is obtained in this case even if the inductance L is replaced by capacitance C.

Accordingly, from Equations (86) to (88), the following transformed equations are obtained:

$$Rs2 = -R2 \quad (89)$$

$$C_{p2} = C_s + \frac{1}{R_2} \quad (90)$$

$$C_{s2} = \frac{L_2}{R_2^2} \quad (91)$$

Thus, it will be understood that the complex conductance Gp2 connected in parallel with the elliptic capacitor (Cp2) can be eliminated.

Accordingly, if the couplers (OTAs 117 and 118 and OTAs 119 and 120) of the elliptic capacitors (C2) between I and Q are eliminated from the complex third-order inverse Chebychev filters shown in FIGS. 7, 8, 9 and 10, the resulting configurations are as illustrated in FIGS. 14, 15, 16 and 17. In the complex third-order inverse Chebychev filters shown in FIGS. 14, 15, 16 and 17, the transmission zero point on the low-frequency side is zero frequency.

Furthermore, the constants are changed, i.e., doubled, to C1=C3=½, and the gm value of these couplers is halved, i.e., made gm3=1.

By doubling the gm value of the gyrator that implements the imaginary resistance by the admittance transformation (i.e., by establishing gm4=¼) and quadrupling the capacitor connected in series therewith (i.e., by establishing Cs2=⅛), the passband can be halved while maintaining the center frequency as is.

In this case, according to Equation (90), Cp2 becomes larger than the former elliptic capacitor (C2) by 1/R2, and the elliptic capacitor (Cp2) and Cs2 become values that are fairly close. Here it is assumed that the elliptic capacitor (Cp2) is made to agree with Cs2. In this complex filter circuit, if the elliptic capacitor (Cp2) and Cs2 are different, a spurious appears in the negative frequency region, the image frequency is no longer reduced and problems occur.

Figure 18:
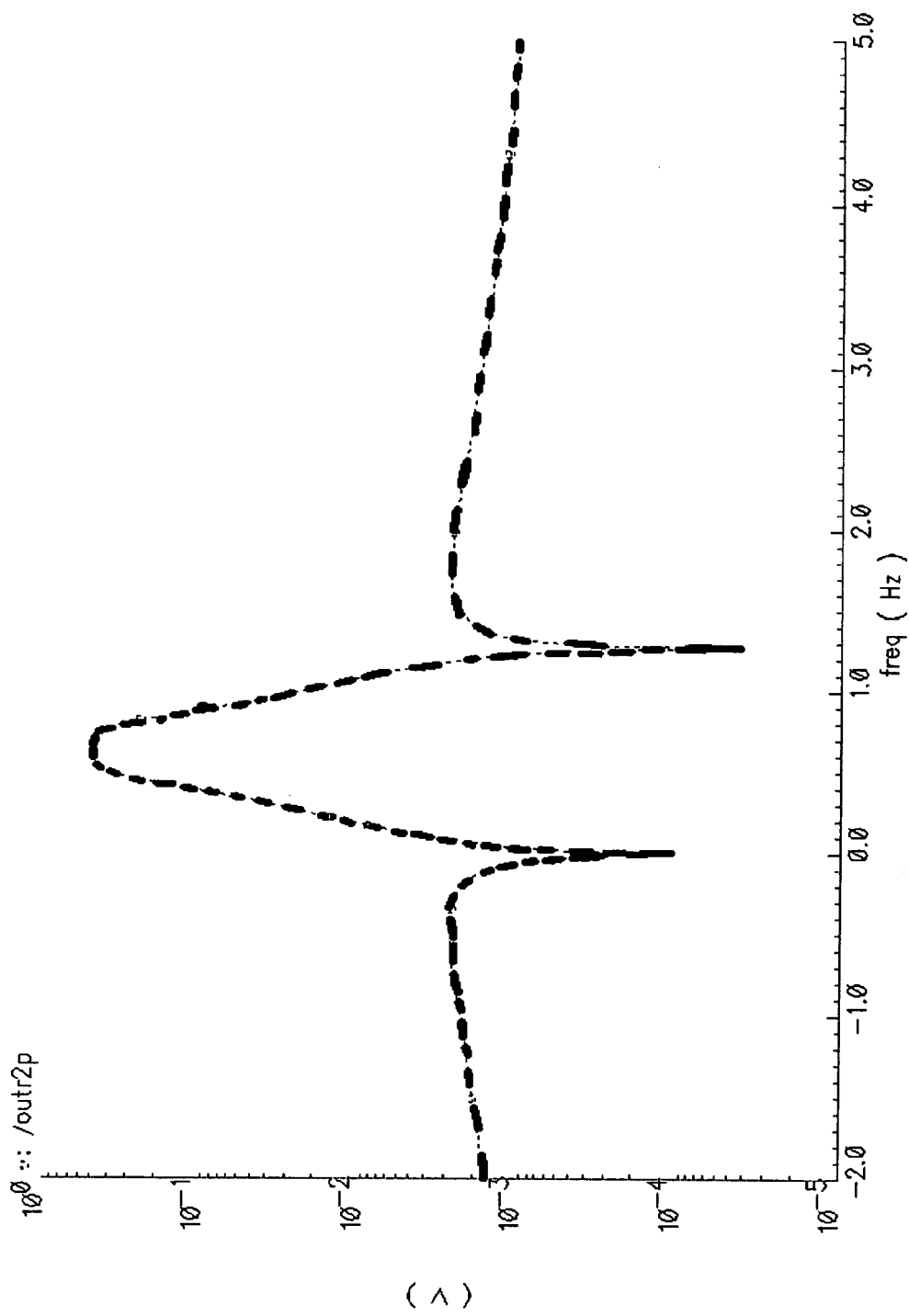
FIG. 18 is a diagram showing one characteristic of a simplified complex third-order inverse Chebychev filter circuit according to the present invention.

The frequency characteristic of the complex filter in this case is illustrated in FIG. 18. A complex filter having transmission zero points at zero frequency and on the high-frequency side is obtained.

The element parameters in this case are as follows: gm1=gm2=gm5=½, gm3=1, gm4=¼, C1=C3=½, C2=1/32, Cs2=⅛, the gm value is doubled, ½, and the capacitance values become ¼, 1/16. Although the values of the gm value and capacitance value are enlarged further, even in this case the increase stops at a whole-number multiple of 2, 4 and 16.

In FIGS. 14, 15, 16 and 17, the transmission zero point on the high-frequency side can be halved by changing the element constants, and the passband width and center frequency can be halved. As an example of a specific change in constants, gm3 is halved, gm4 is doubled and Cs2 is quadrupled.

The frequency characteristic of the complex filter in this case is illustrated in FIG. 19. A complex filter having transmission zero points at zero frequency and on the high-frequency side is obtained. The element parameters in this case are as follows: gm1=gm2=gm5=½, gm3=1, gm4=¼, C1=C3=½, C2=Cs2=⅛, the gm value is doubled to ½, and the capacitance values become ¼. Although the values of the gm value and capacitance value are enlarged further, even in this case the increase stops at whole-number multiples of 2 and 4.

Figure 20:
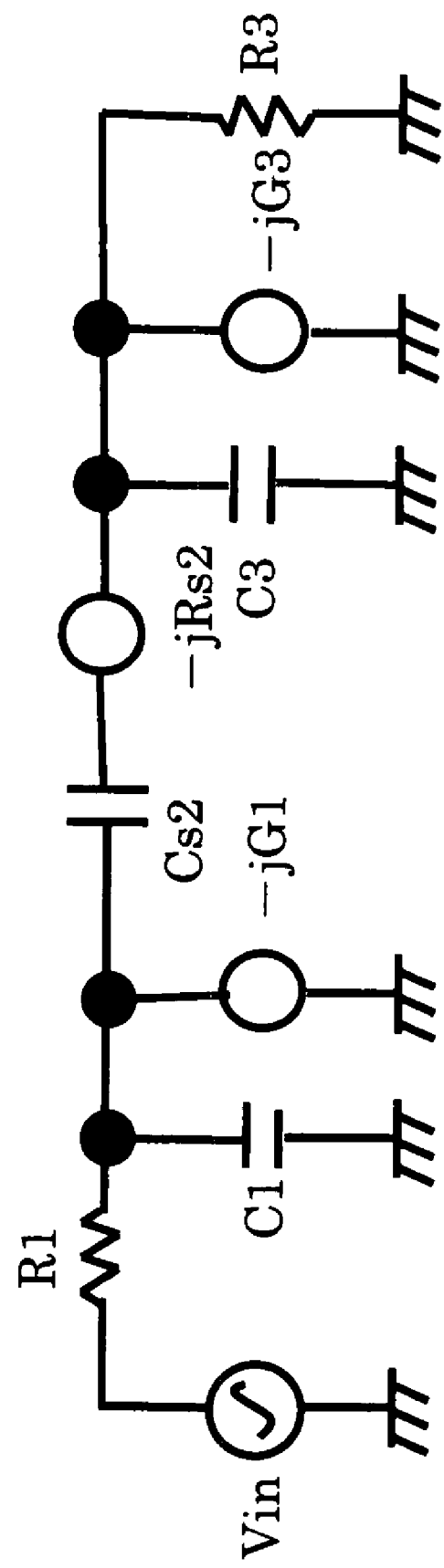
FIG. 20 is a diagram illustrating the structure of a further simplified complex third-order filter circuit from which an elliptic capacitor has been eliminated according to the present invention.
Figure 21:
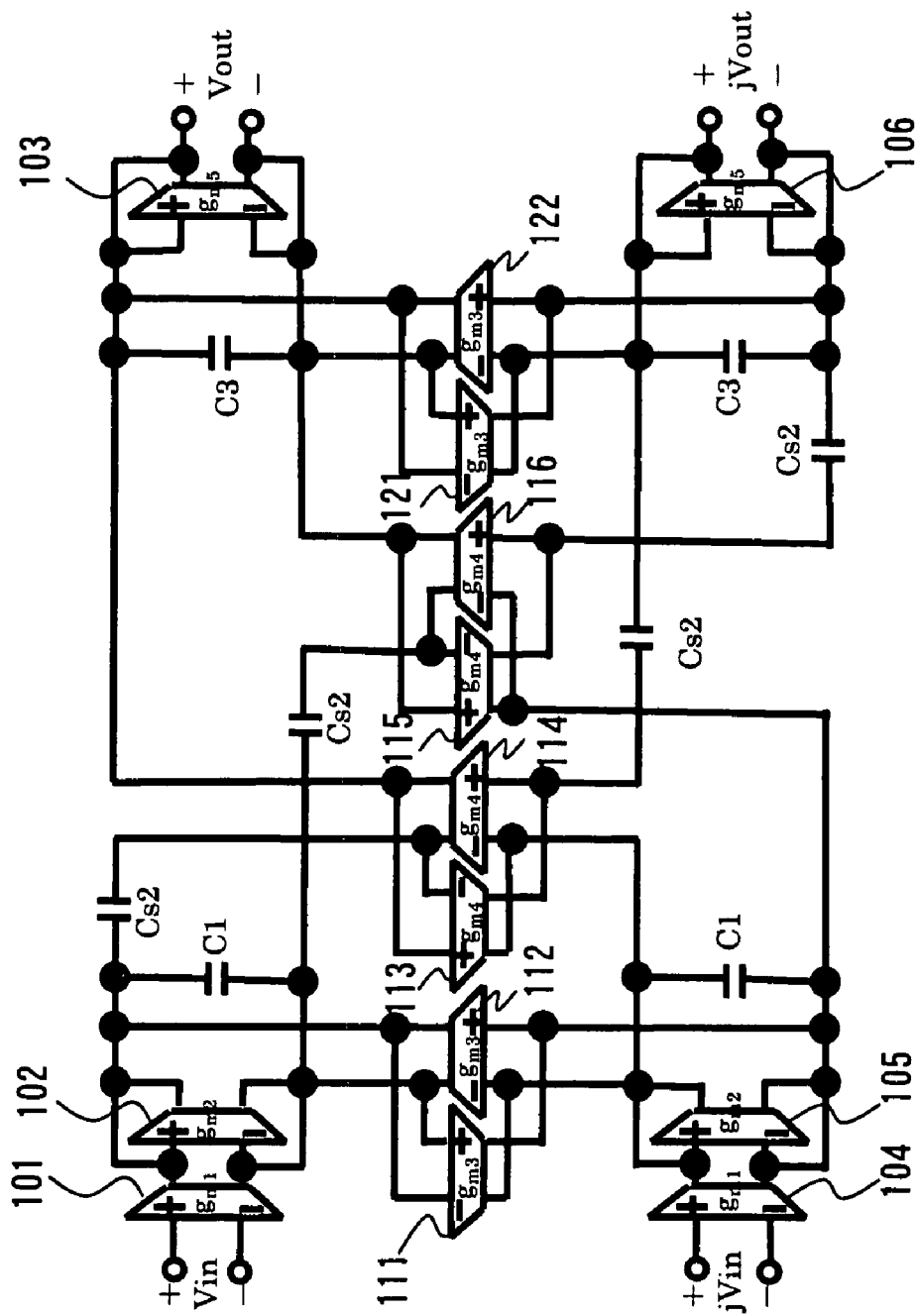
FIG. 21 is a diagram illustrating the structure of a further simplified first complex third-order gm-C filter circuit from which an elliptic capacitor has been eliminated according to the present invention.
Figure 22:
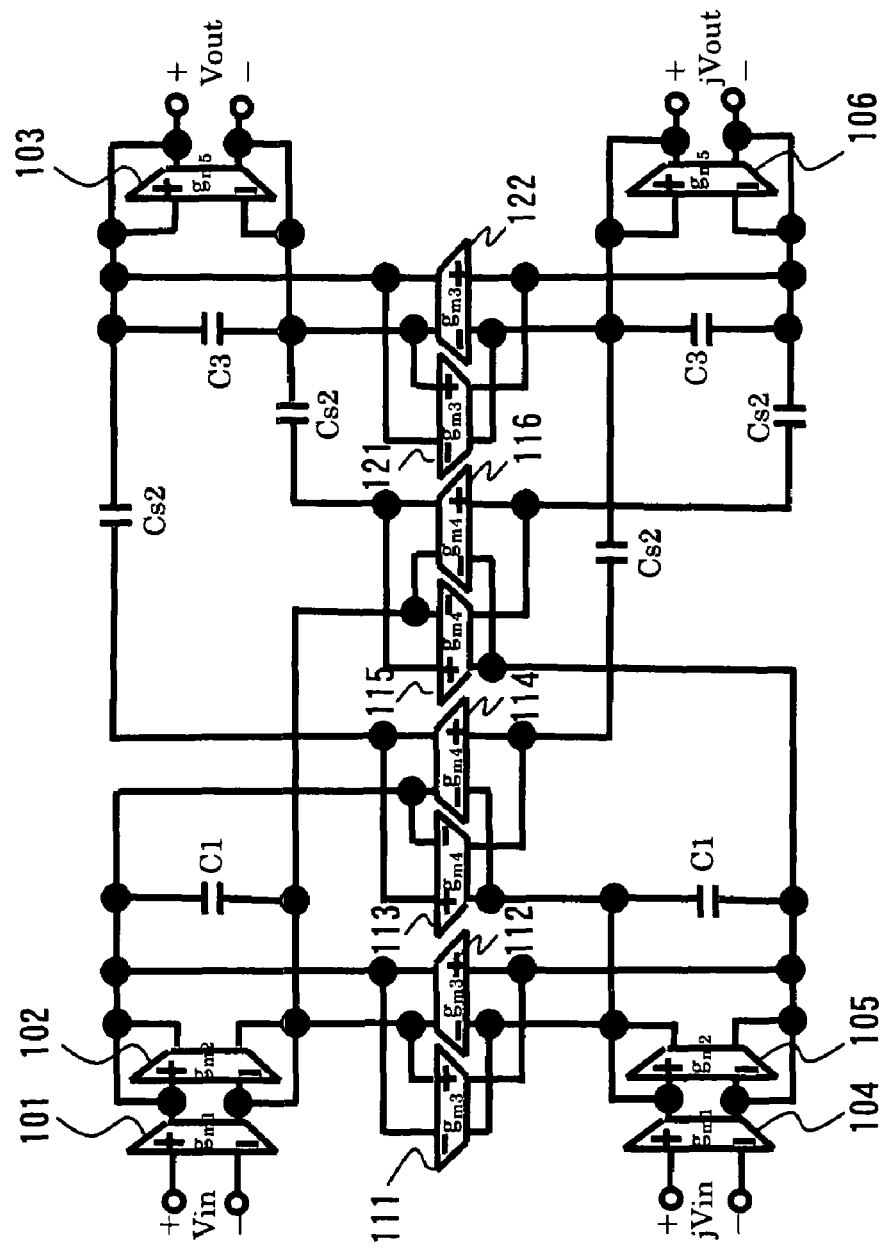
FIG. 22 is a diagram illustrating the structure of a further simplified second complex third-order gm-C filter circuit from which an elliptic capacitor has been eliminated according to the present invention.
Figure 23:
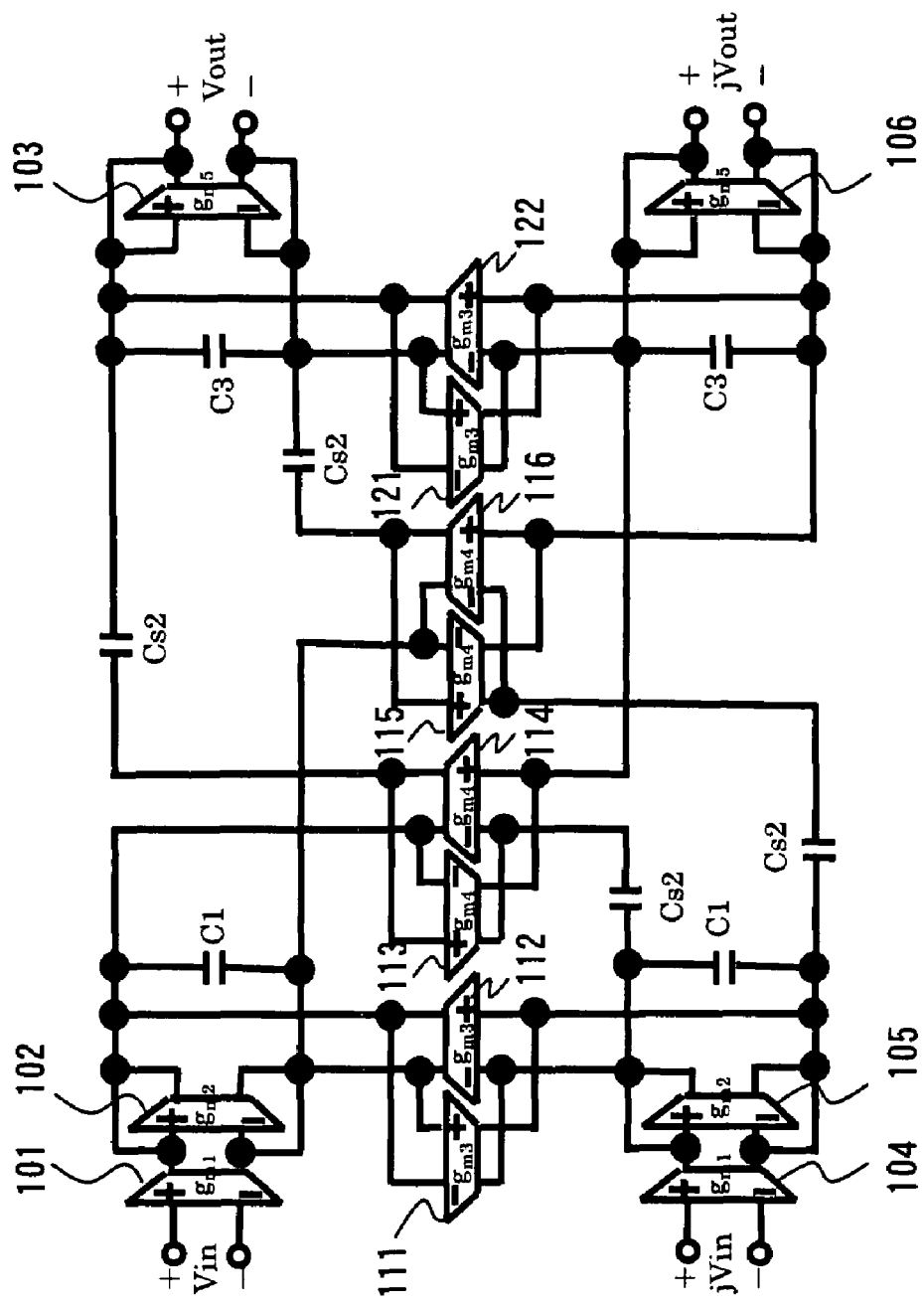
FIG. 23 is a diagram illustrating the structure of a further simplified third complex third-order gm-C filter circuit from which an elliptic capacitor has been eliminated according to the present invention.
Figure 24:
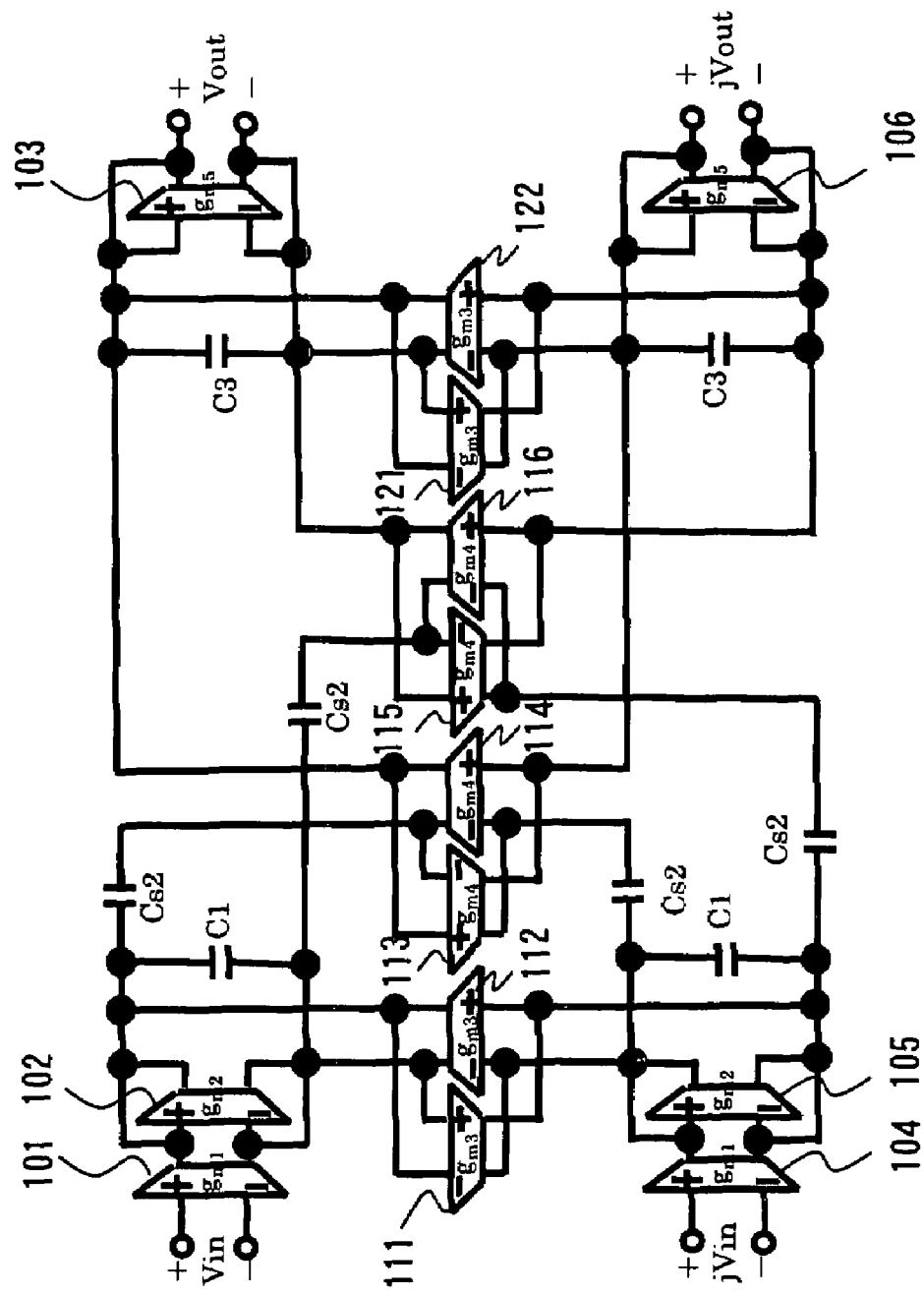
FIG. 24 is a diagram illustrating the structure of a further simplified fourth complex third-order gm-C filter circuit from which an elliptic capacitor has been eliminated according to the present invention.

There are also cases where the transmission zero point need not be in the high-frequency region if the image frequency can be eliminated. That is, a complex filter shown in FIG. 20 is obtained.

In this gm-C filter circuit, the elliptic capacitor (C2) is deleted from FIG. 12 and complex filter circuits shown in FIGS. 21, 22, 23 and 24 are obtained.

Figure 25:
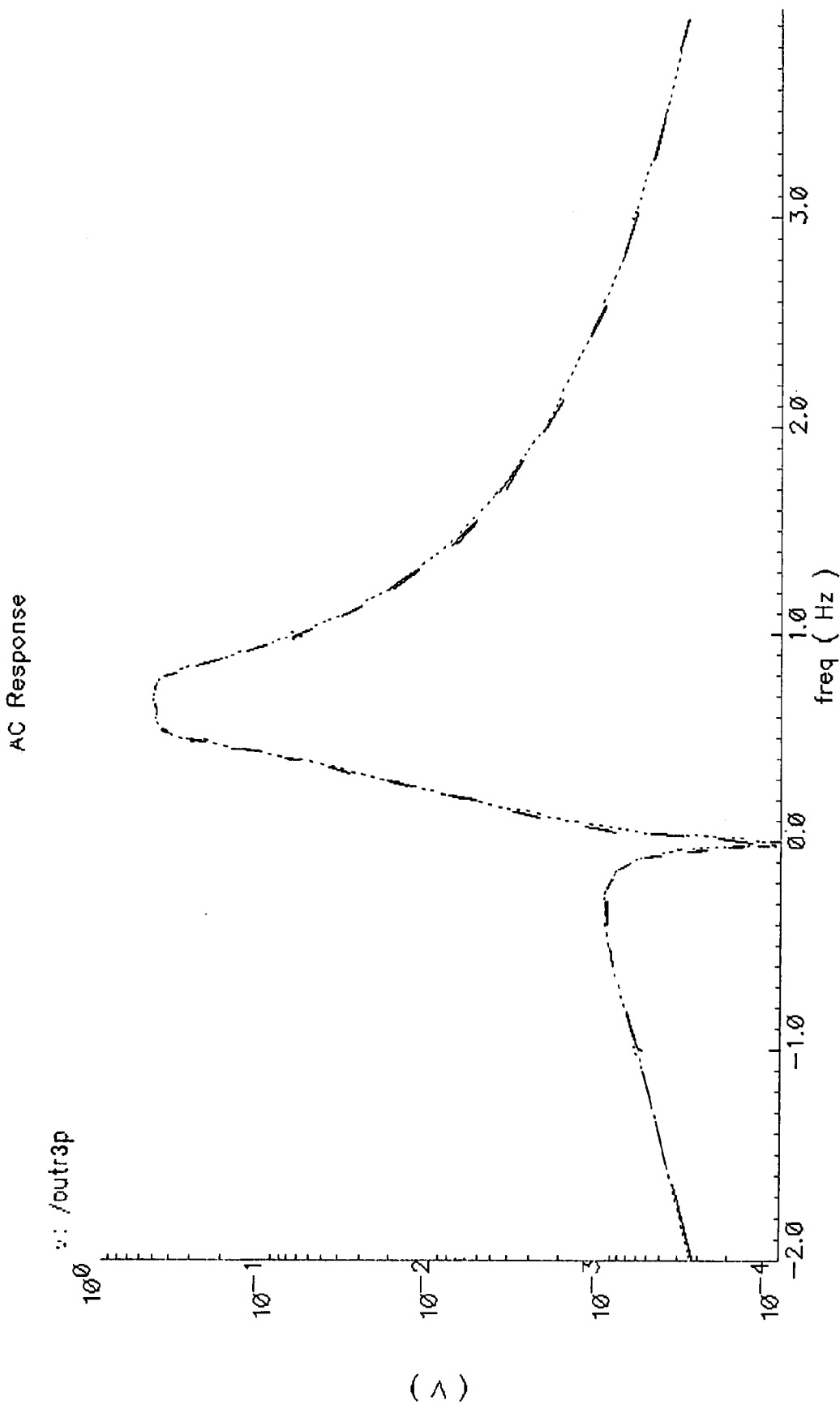
FIG. 25 is a diagram illustrating a characteristic of a further simplified complex third-order gm-C filter circuit from which an elliptic capacitor has been eliminated according to the present invention.
Figure 26:
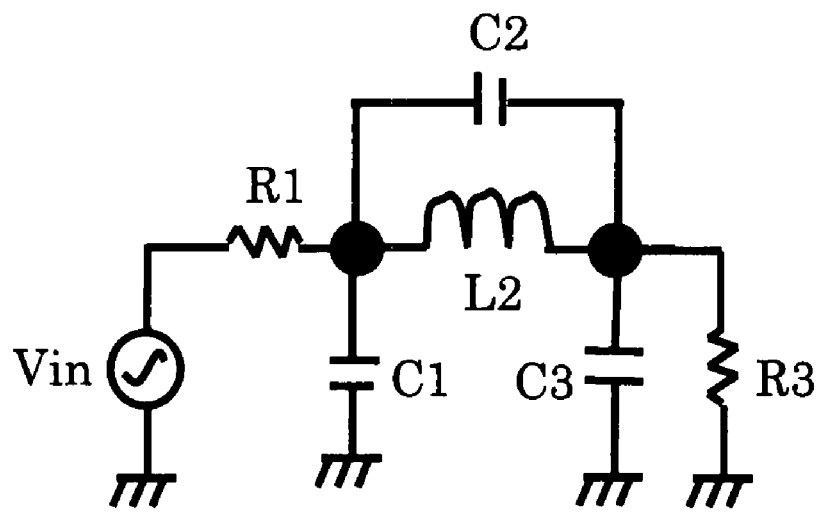
FIG. 26 is a diagram illustrating the structure of a third-order elliptic RLC ladder filter useful in describing a circuit according to the prior art.
Figure 27:
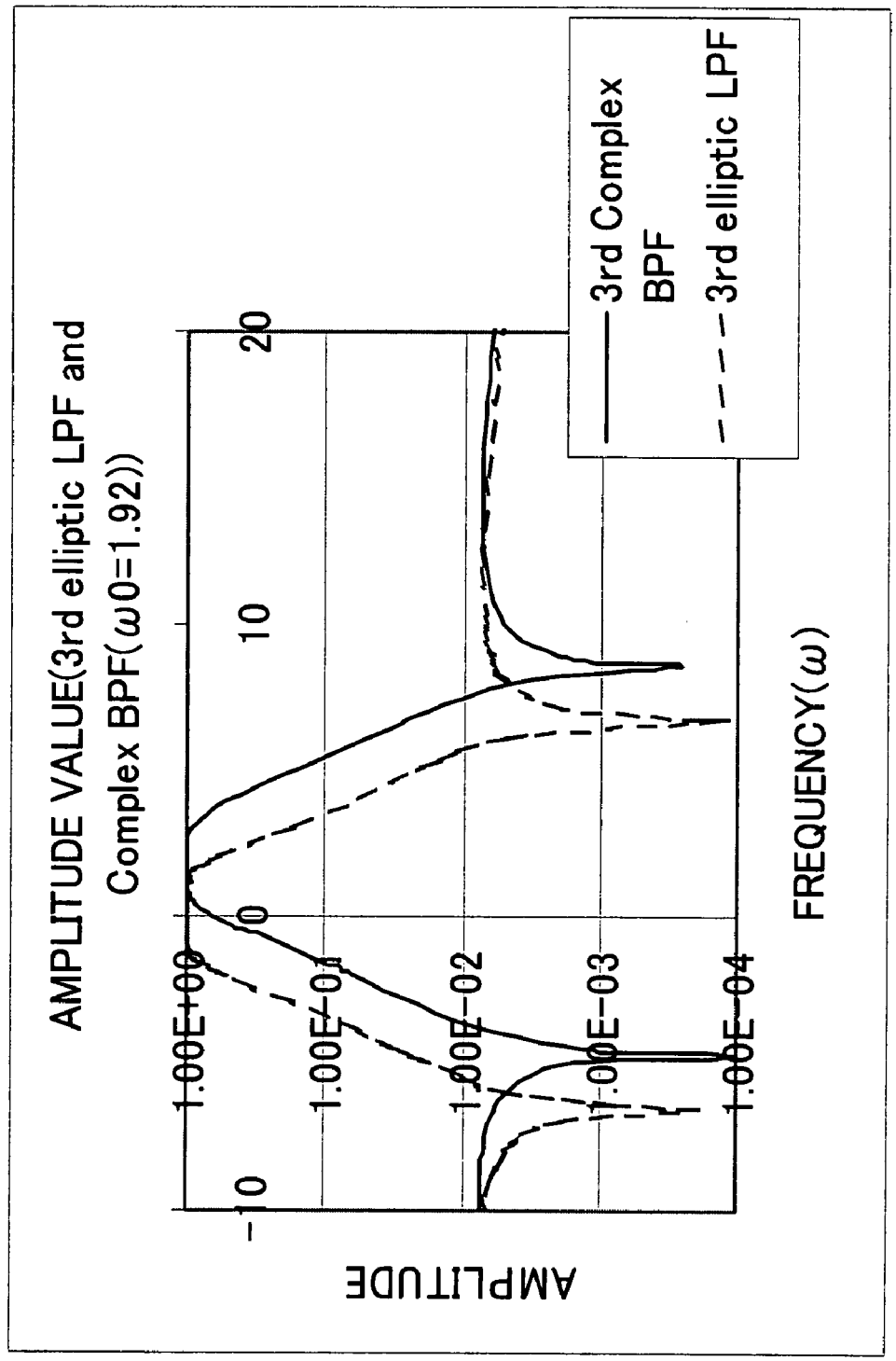
FIG. 27 is a frequency characteristic diagram useful in describing a complex filter characteristic.
Figure 28:
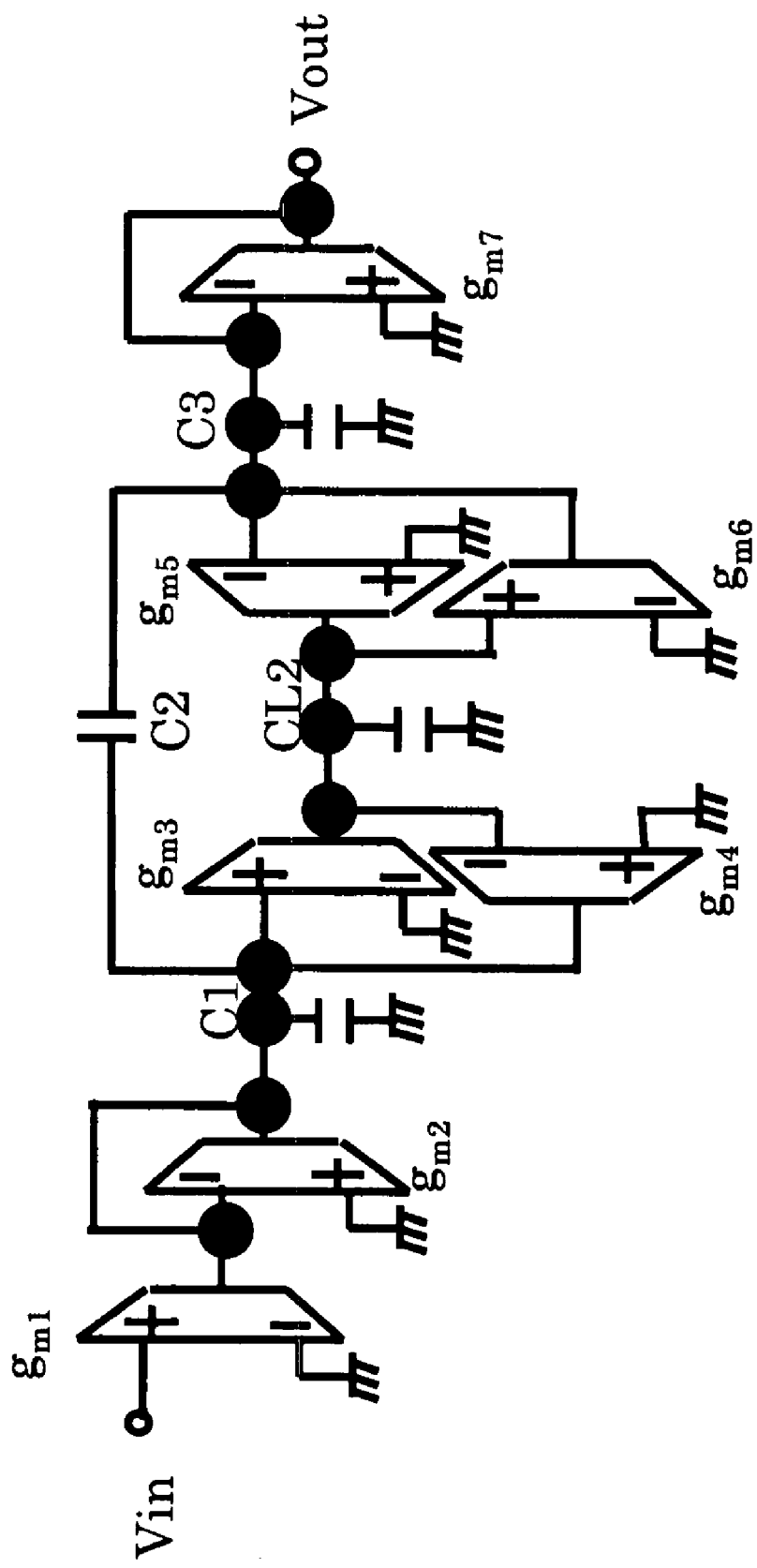
FIG. 28 is a diagram illustrating the structure of a third-order elliptic gm-C filter circuit (single-ended) useful in describing the conventional circuit.
Figure 30:
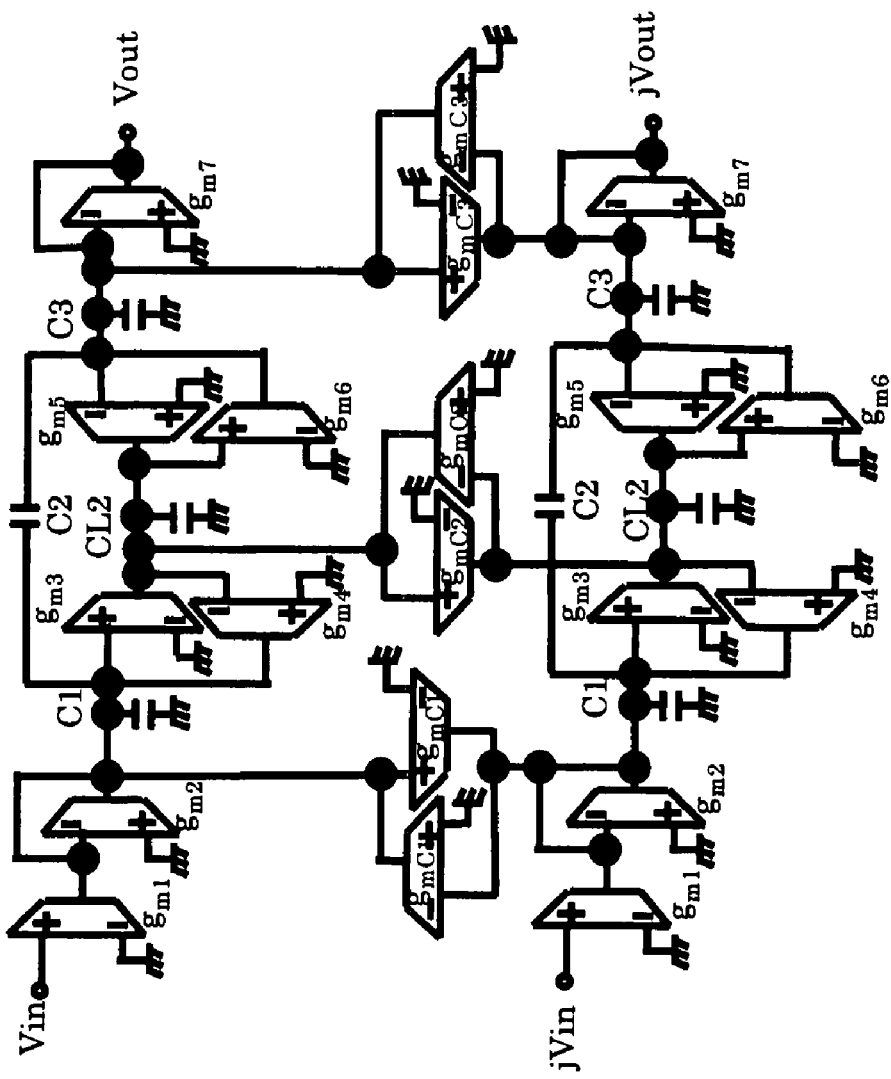
FIG. 30 is a diagram illustrating the structure of a complex third-order elliptic gm-C filter circuit (single-ended) according to the prior art.
Figure 31:
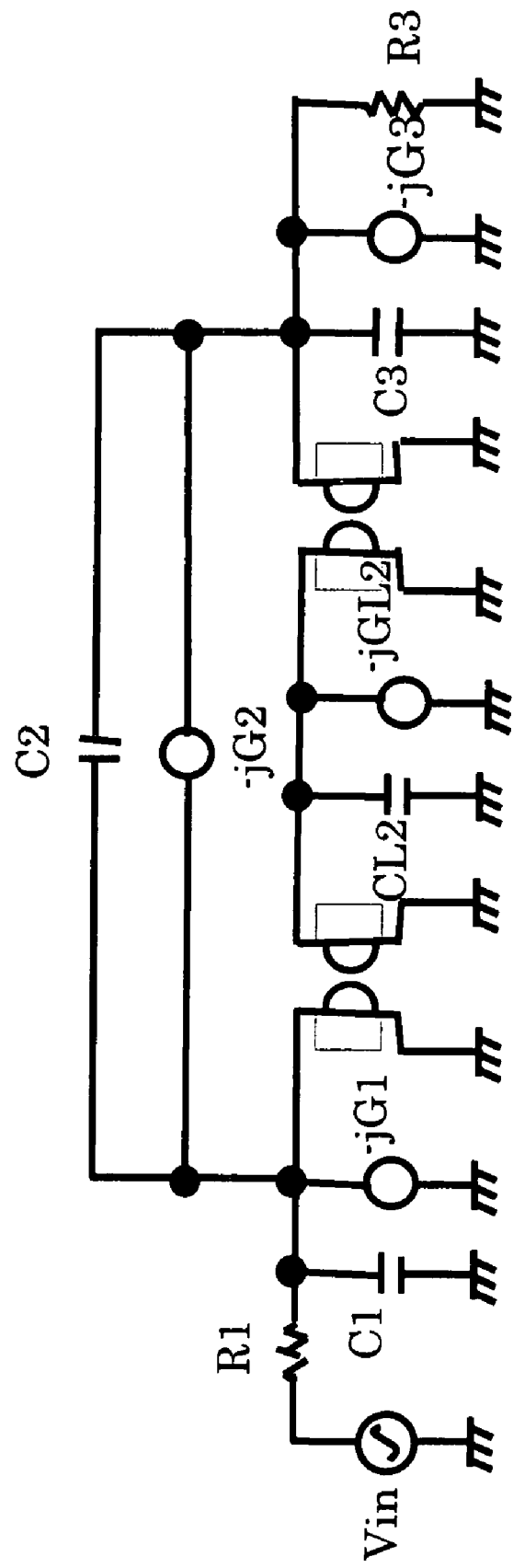
FIG. 31 is a diagram illustrating an equivalent circuit of a complex third-order elliptic filter using a gyrator.
Figure 32:
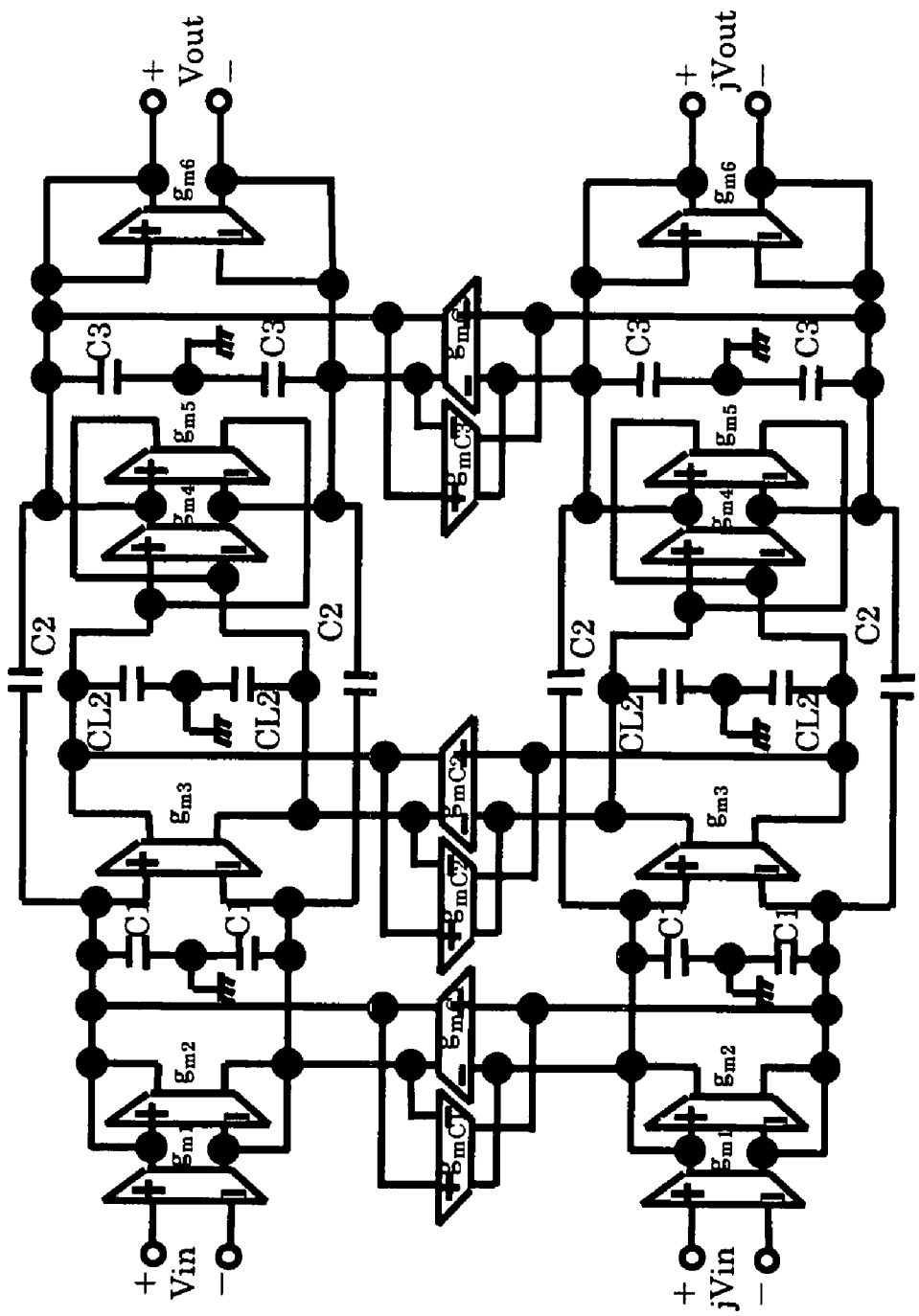
FIG. 32 is a diagram illustrating the structure of a complex third-order elliptic gm-C filter circuit (fully differential) according to the prior art.
Figure 33:
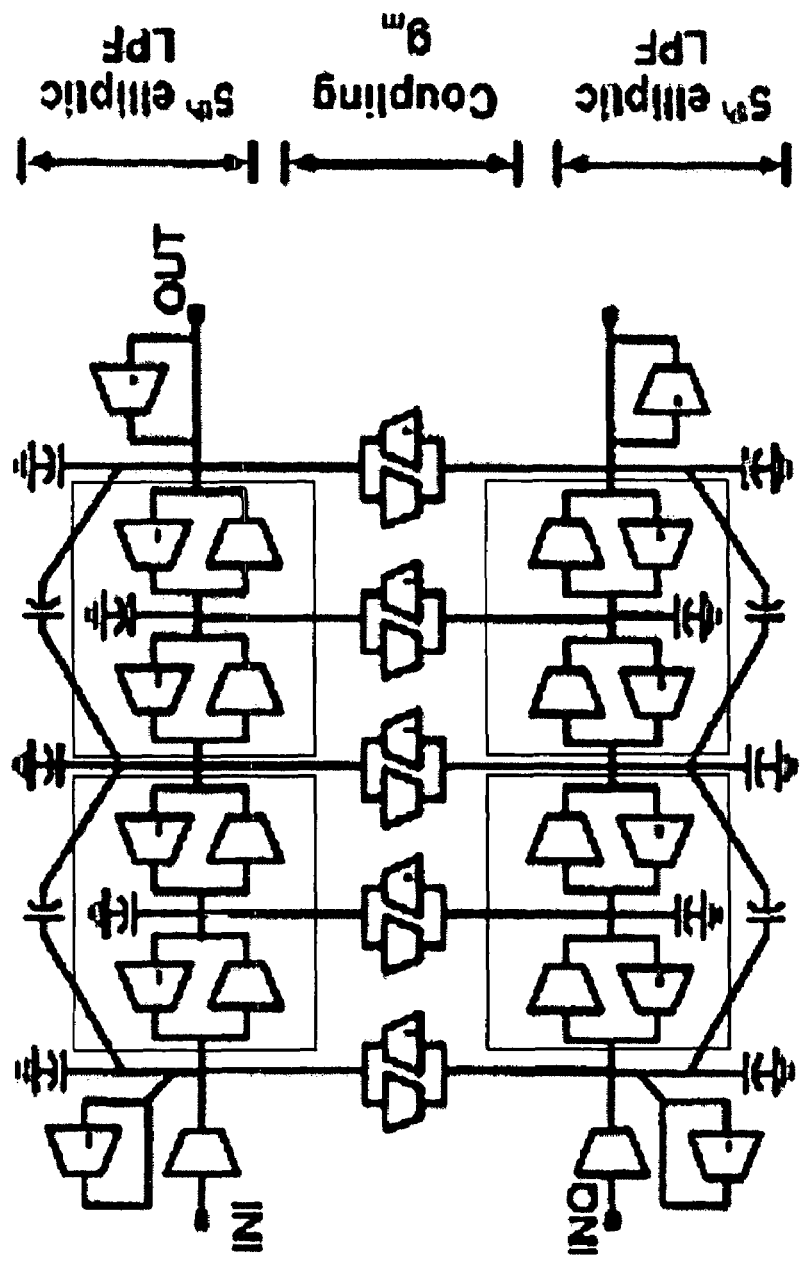
FIG. 33 is a diagram illustrating the structure of a complex fifth-order elliptic gm-C filter circuit according to the prior art.

The frequency characteristic of the complex filter obtained in this case is illustrated in FIG. 25. Although this filter has a transmission zero point at zero frequency, it has no transmission point in the high-frequency region. The element parameters in this case are as follows: gm1=gm2=gm5=½, gm3=2, gm4=⅛, C1=C3=½, Cs2=1/32, the gm value is quadrupled to ¼, and the capacitance values become 1/16. Although the values of the gm value and capacitance value are enlarged further, even in this case the increase stops at whole-number multiples of 4 and 16.

A filter circuit integrated on an LSI chip can be mentioned as an application example of the present invention. The invention may be applied first of all to insertion loss of a filter circuit itself due to variations in manufacture, to adjustment of a shi0ft in voltage gain of a filter and to a channel selection filter for reception in a chip for a mobile wireless terminal. In a case where the invention is applied to a low-IF channel selection filter for reception, the present invention, which is readily maintains a flat characteristic in a passband, is very effective.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A complex filter circuit which receives a signal of an in-phase component and a signal of a quadrature component, and which has a circuit on the in-phase side and a circuit on the quadrature side being identically constructed, each circuit comprising:
   a first OTA (Operational Transconductance Amplifier) which receives differential signals differentially;
   a second OTA which receives differential outputs of said first OTA differentially;
   a first capacitor connected between commonly connected differential outputs of said first and second OTAs;
   a third OTA having differential inputs connected via second capacitors of positive and negative phases to respective ones of the commonly connected differential outputs of said first and second OTAs; and
   a third capacitor connected between differential inputs of said third OTA;
   the differential outputs and differential inputs of said third OTA being commonly connected to differential output terminals;
   wherein said complex filter circuit further comprises first to sixth OTA pairs as a coupler of the in-phase and quadrature sides, each OTA pair having two terminals at which differential inputs of one OTA thereof and differential outputs of the other OTA thereof are respectively connected, and another two terminals at which differential outputs of the one OTA and differential inputs of the other OTA are respectively connected;
   the two terminals of said first OTA pair are connected to both ends of the first capacitor on the in-phase side, and the two other terminals of said first OTA pair are connected to both ends of the first capacitor on the quadrature side;
   the two terminals of said second OTA pair are respectively connected to one end of one of said first and third capacitors on the in-phase side via a capacitor and to one end of the other of said first and third capacitors on the in-phase side directly, and the other two terminals of said second OTA pair are respectively connected to one end of one of said first and third capacitors on the quadrature side via a capacitor and to one end of the other of said first and third capacitors on the quadrature side directly;
   the two terminals of said third OTA pair are respectively connected to the other end of one of said first and third capacitors on the in-phase side via a capacitor and to the other end of the other of said first and third capacitors on the in-phase side directly, and the other two terminals of said second OTA pair are respectively connected to the other end of one of said first and third capacitors on the quadrature side via a capacitor and to the other end of the other of said first and third capacitors on the quadrature side directly;
   the two terminals of said fourth OTA pair are connected to both ends of the positive-phase second capacitor on the in-phase side and the other two terminals are connected to both ends of the positive-phase second capacitor on the quadrature side;
   the two terminals of said fifth OTA pair are connected to both ends of the negative-phase second capacitor on the in-phase side and the other two terminals are connected to both ends of the negative-phase second capacitor on the quadrature side; and
   the two terminals of said sixth OTA pair are connected to both ends of the third capacitor on the in-phase side and the other two terminals of said sixth OTA pair are connected to both ends of the third capacitor on the quadrature side.

2. A complex filter circuit which receives a signal of an in-phase component and a signal of a quadrature component, and which a circuit on the in-phase side and a circuit on the quadrature side being identically constructed, each circuit comprising:
   a first OTA (Operational Transconductance Amplifier) to which differential signals are differentially input;
   a second OTA to which differential outputs of said first OTA are differentially input;
   a first capacitor connected between commonly connected differential outputs of said first and second OTAs;
   a third OTA having differential inputs connected via second capacitors of positive and negative phases to respective ones of the commonly connected differential outputs of said first and second OTAs; and
   a third capacitor connected between differential inputs of said third OTA;
   the differential outputs and differential inputs of said third OTA being commonly connected to differential output terminals;
   wherein said complex filter circuit further comprises first to fourth OTA pairs as a coupler of the in-phase and quadrature sides, each OTA pair having two terminals at which differential inputs of one OTA thereof and differential outputs of the other OTA thereof are respectively connected, and another two terminals at which differential outputs of the one OTA and differential inputs of the other OTA are respectively connected;
   the two terminals of said first OTA pair are connected to both ends of the first capacitor on the in-phase side, and the two other terminals of said first OTA pair are connected to both ends of the first capacitor on the quadrature side;
   the two terminals of said second OTA pair are respectively connected to one end of one of said first and third capacitors on the in-phase side via a capacitor and to one end of the other of said first and third capacitors on the in-phase side directly, and the other two terminals of said second OTA pair are respectively connected to one end of one of said first and third capacitors on the quadrature side via a capacitor and to one end of the other of said first and third capacitors on the quadrature side directly;
   the two terminals of said third OTA pair are respectively connected to the other end of one of said first and third capacitors on the in-phase side via a capacitor and to the other end of the other of said first and third capacitors on the in-phase side directly, and the other two terminals of said second OTA pair are respectively connected to the other end of one of said first and third capacitors on the quadrature side via a capacitor and to the other end of the other of said first and third capacitors on the quadrature side directly; and
   the two terminals of said fourth OTA pair are connected to both ends of the third capacitor on the in-phase side and the other two terminals are connected to both ends of the third capacitor on the quadrature side.

3. The circuit according to claim 2, wherein said second capacitors of positive and negative phases are removed.

4. The circuit according to claim 1, wherein values of mutual conductance of said first, second and third OTAs are set to be equal, and each mutual conductance of said second and third OTA pairs coupling said first and third capacitors is made a whole-number multiple of mutual conductances of said first, second and third OTAs.

5. The circuit according to claim 2, wherein values of mutual conductance of said first, second and third OTAs are set to be equal, and each mutual conductance of said second and third OTA pairs coupling said first and third capacitors is made a whole-number multiple of mutual conductances of said first, second and third OTAs.

6. The circuit according to claim 4, wherein a capacitance value of a capacitor connected to one end of one of said first and third capacitors on the in-phase side and to one end of one of said first and third capacitors on the quadrature side in said second OTA pair and the capacitance value of a capacitor connected to the other end of one of said first and third capacitors on the in-phase side and to the other end of one of said first and third capacitors on the quadrature side in said third OTA pair are made a whole-number fraction of capacitance values of said first and third capacitors that have been set to be equal to each other.

7. The circuit according to claim 5, wherein a capacitance value of a capacitor connected to one end of one of said first and third capacitors on an in-phase side and to one end of one of said first and third capacitors on a quadrature side in said second OTA pair and the capacitance value of a capacitor connected to the other end of one of said first and third capacitors on the in-phase side and to the other end of one of said first and third capacitors on the quadrature side in said third OTA pair are made a whole-number fraction of capacitance values of said first and third capacitors that have been set to be equal to each other.

* * * * *